(12) United States Patent
Yonemura et al.

(10) Patent No.: US 8,730,366 B2
(45) Date of Patent: May 20, 2014

(54) SOLID-STATE IMAGING DEVICE, METHOD OF DRIVING SOLID-STATE IMAGING DEVICE, AND CAMERA

(75) Inventors: Koichi Yonemura, Kyoto (JP); Hirokazu Shiraki, Kyoto (JP); Akira Tsukamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 84 days.

(21) Appl. No.: 13/609,315

(22) Filed: Sep. 11, 2012

(65) Prior Publication Data
US 2013/0002921 A1 Jan. 3, 2013

Related U.S. Application Data

(63) Continuation of application No. PCT/JP2011/001254, filed on Mar. 3, 2011.

(30) Foreign Application Priority Data

Mar. 15, 2010 (JP) ................................. 2010-058240

(51) Int. Cl.
*H04N 3/14* (2006.01)
*H04N 5/335* (2011.01)
*H04N 5/345* (2011.01)
*H04N 5/347* (2011.01)

(52) U.S. Cl.
CPC ............. *H04N 5/3458* (2013.01); *H04N 5/347* (2013.01); *H04N 5/335* (2013.01); *H04N 3/14* (2013.01)
USPC .......................................... 348/311; 348/302

(58) Field of Classification Search
CPC ................... H01L 27/14812; H01L 27/14843; H04N 5/3458; H04N 5/347; H04N 5/37213; H04N 5/335; H04N 3/14
See application file for complete search history.

(56) References Cited

U.S. PATENT DOCUMENTS

| 4,987,466 A | 1/1991 | Shibata et al. |
| 7,760,261 B2 * | 7/2010 | Kobayashi ................... 348/311 |

(Continued)

FOREIGN PATENT DOCUMENTS

| JP | 62-152158 | 7/1987 |
| JP | 1-308072 | 12/1989 |

(Continued)

OTHER PUBLICATIONS

International Search Report issued May 24, 2011 in International (PCT) Application No. PCT/JP2011/001254.

*Primary Examiner* — Lin Ye
*Assistant Examiner* — Amy Hsu
(74) *Attorney, Agent, or Firm* — Wenderoth, Lind & Ponack, LLP.

(57) ABSTRACT

A solid-state imaging device is provided in which transfer failure of signal charges is suppressed. The solid-state imaging device includes a plurality of photoelectric conversion units, a plurality of vertical transfer units having a plurality of vertical transfer electrodes, a plurality of horizontal transfer units having a plurality of horizontal transfer electrodes, and an intermediate transfer unit having a branch transfer electrode. In the first horizontal transfer unit, one of the horizontal transfer electrodes includes a plurality of column direction electrodes that are disposed adjacent to one another in the vertical direction and transfer the signal charges via the intermediate transfer unit to the second horizontal transfer unit. The vertical transfer electrode, the horizontal transfer electrodes, and the branch transfer electrode are a single layer electrode.

13 Claims, 31 Drawing Sheets

(56) References Cited

U.S. PATENT DOCUMENTS

| | | | |
|---|---|---|---|
| 8,319,877 B2 * | 11/2012 | Kanbe | 348/311 |
| 2007/0126906 A1 * | 6/2007 | Kuwahara et al. | 348/311 |
| 2007/0216970 A1 * | 9/2007 | Kobayashi | 358/513 |
| 2007/0229691 A1 * | 10/2007 | Oshima et al. | 348/315 |
| 2008/0239123 A1 * | 10/2008 | Hirota | 348/302 |
| 2009/0020789 A1 * | 1/2009 | Shiraki et al. | 257/231 |
| 2010/0002121 A1 * | 1/2010 | Fujioka | 348/314 |
| 2010/0053404 A1 * | 3/2010 | Shiraki et al. | 348/311 |
| 2010/0066886 A1 * | 3/2010 | Kanbe | 348/311 |
| 2011/0075003 A1 * | 3/2011 | Suzuki et al. | 348/311 |

FOREIGN PATENT DOCUMENTS

| | | |
|---|---|---|
| JP | 4-099381 | 3/1992 |
| JP | 6-097412 | 4/1994 |
| JP | 6-163871 | 6/1994 |
| JP | 6-319081 | 11/1994 |
| JP | 2010-016017 | 1/2010 |
| JP | 2010-073901 | 4/2010 |

* cited by examiner

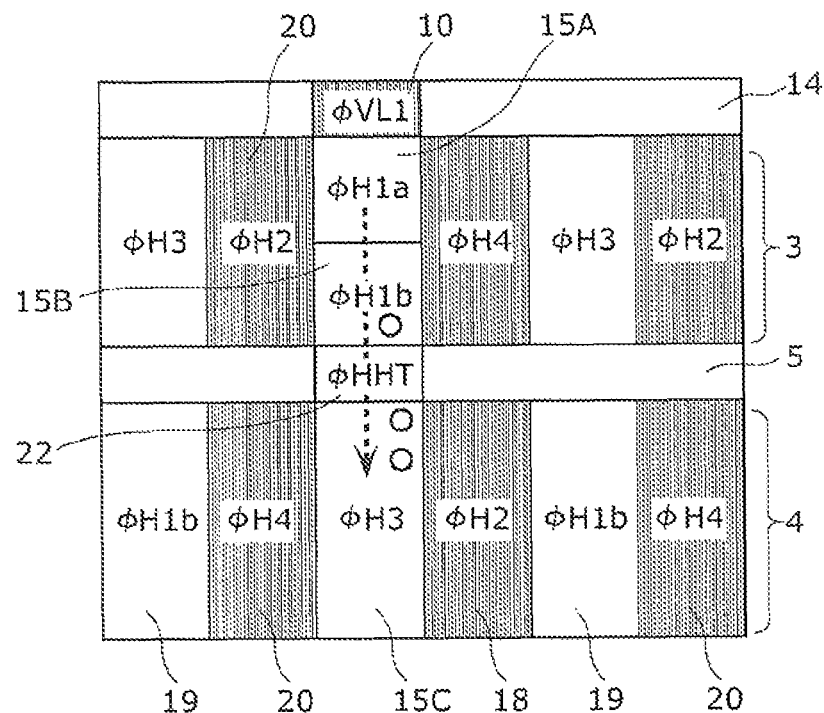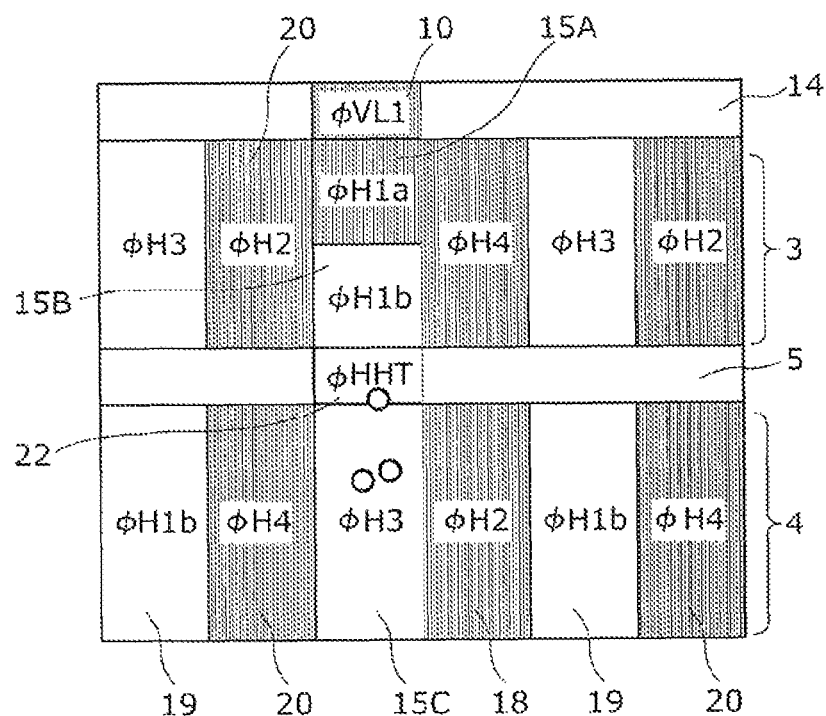

SOLID-STATE IMAGING DEVICE, METHOD OF DRIVING SOLID-STATE IMAGING DEVICE, AND CAMERA

CROSS REFERENCE TO RELATED APPLICATION

This is a continuation application of PCT Patent Application No. PCT/JP2011/001254 filed on Mar. 3, 2011, designating the United States of America, which is based on and claims priority of Japanese Patent Application No. 2010-058240 filed on Mar. 15, 2010. The entire disclosures of the above-identified applications, including the specifications, drawings and claims are incorporated herein by reference in their entirety.

TECHNICAL FIELD

The present invention relates to solid-state imaging devices and methods of driving the same, and particularly relates to a structure of a CCD for digital still cameras that realizes a moving picture function with low electricity consumption and a high frame rate, and a method of driving the CCD.

BACKGROUND ART

Hereinafter, CCD solid-state imaging devices in the related art will be described with reference to the drawings.

Recently, in solid-state imaging devices, the number of pixels in the horizontal direction has been increased in order to meet a demand for higher resolution. This results in a higher driving rate of a horizontal CCD register (horizontal transfer unit), causing problems such as reduction in transfer efficiency and increase in electricity consumption. As a method for solving such problems, techniques for providing a plurality of horizontal transfer units arranged in parallel have been reported (for example, see Patent Literatures 1 and 2).

In the solid-state imaging device described in Patent Literature 1, the shape of a storage electrode in a horizontal transfer unit for performing branch transfer is devised, or the concentration of impurities on the branch transfer unit side (in the vertical transfer direction) is increased in the horizontal transfer unit for performing branch transfer. Thereby, a potential gradient is formed in the vertical transfer direction to suppress branch transfer failure. Unfortunately, in these structures, the potential gradient is always formed under a horizontal electrode. This causes various problems: the saturated charge amount in the horizontal transfer unit is reduced; or signal charges are horizontally transferred in a meandering manner during horizontal transfer to increase an effective transfer length per transfer stage, resulting in transfer failure.

In order to improve such problems, the solid-state imaging device described in Patent Literature 2 includes a storage electrode in a horizontal transfer unit for performing branch transfer wherein the storage electrode includes a plurality of electrode elements, and charges are transferred by applying a different driving pulse to each of the electrode elements during branch transfer.

FIG. 19 is a configuration diagram showing part of a horizontal transfer unit of a solid-state imaging device in the related art, which is described in Patent Literature 2. FIG. 20 is a potential schematic view showing a cross-sectional structure of a topmost layer of the horizontal transfer unit taken along the line B-B' shown in FIG. 19, and potential distributions and transfer states of signal charges under the respective electrodes. FIG. 21 is a drawing showing a timing at which the respective transfer pulses are applied to the corresponding electrodes in FIG. 19 during a horizontal blanking period. FIG. 20 shows the potential distributions and transfer states of signal charges under the respective electrodes during Periods N1 to N5 in FIG. 21.

The solid-state imaging device described in Patent Literature 2 includes a channel stop 201, an intermediate transfer unit 206, a final vertical transfer electrode 207, horizontal storage electrodes 209 and 211, a horizontal barrier electrode 210, and a barrier region 213 as shown in FIG. 19. The horizontal storage electrodes 209 and 211 and the horizontal barrier electrode 210 form a horizontal transfer electrode. The horizontal transfer electrode has a structure for horizontal two-phase drive in which voltages φH1 and φH2A (φH2B) are applied to the corresponding electrodes during the horizontal transfer to transfer the signal charges via a channel 215 provided in a semiconductor substrate 214 shown in FIG. 20.

The horizontal storage electrode 211 transfers the signal charges from a first horizontal transfer unit 204 to a second horizontal transfer unit 205, and includes a first electrode element 211A and a second electrode element 211B. The first electrode element 211A covers substantially the center of the channel in the first horizontal transfer unit 204, the intermediate transfer unit 206, and the channel in the second horizontal transfer unit 205, and forms a storage electrode for the first horizontal transfer unit 204 and the second horizontal transfer unit 205. The second electrode element 211B covers the channel in the first horizontal transfer unit 204 not covered with the first electrode element 211A, and forms a storage electrode for the first horizontal transfer unit 204. The first electrode element 211A is electrically insulated from the second electrode element 211B. The second electrode element 211B has approximately the same width as that of the first electrode element 211A. As shown in FIG. 19, when observed from above, the second electrode element 211B is overlaid on the first electrode element 211A in a region ranging from the second horizontal transfer unit 205 to approximately a half region on a branch transfer electrode 208 in the first horizontal transfer unit 204.

The storage electrode for the second horizontal transfer unit 205 is composed of only the first electrode element 211A, while the storage electrode for the first horizontal transfer unit 204 is composed of the second electrode element 211B covering approximately a half of the first horizontal transfer unit 204 on the side of the final vertical transfer electrode 207 and the first electrode element 211A covering approximately a half of first horizontal transfer unit 204 on the side of the intermediate transfer unit 206.

The second electrode element 211B and the horizontal barrier electrode 210 are commonly connected while the first electrode element 211A is independently connected to an outside.

Hereinafter, transfer operation will be described using FIGS. 19 to 21. First, φH1 to be applied to the horizontal storage electrode 209 and φH2A and φH2B to be applied to the horizontal storage electrode 211 (first electrode element 211A, second electrode element 211B) are simultaneously set to a high level, and φVL to be applied to the final vertical transfer electrode 207 is set to a low level. Thereby, the signal charges accumulated under the final vertical transfer electrode 207 in a vertical transfer unit 202 (solid dot shown in FIG. 19) are transferred to under the horizontal storage electrode 209 and the horizontal storage electrode 211 (first electrode element 211A, second electrode element 211B) corresponding to the first horizontal transfer unit 204 (Period N1, FIG. 20(a)).

Next, φT to be applied to the branch transfer electrode 208 is set to the high level, φH1 and φH2B are set to the low level at the same time, and φH2A is set to a middle level between the high level and the low level. Thereby, the signal charges are transferred to the intermediate transfer unit 206 (Period N2, FIG. 20(b)).

Subsequently, φH2A is set to the low level, and transfer of the signal charges to the branching channel is completed (Period N3 FIG. 20(c)).

Next, φH1 is set to the high level, and φT is set to the low level. Thereby, the signal charges in the intermediate transfer unit 206 are transferred to under the horizontal storage electrode 209 in the second horizontal transfer unit 205 (Period N4, FIG. 20(d)).

Meanwhile, the signal charges transferred from the vertical transfer unit 203 (blank dot in FIG. 19) remain within the first horizontal transfer unit 204 during Periods N2 to N4. Thereby, the signal charges in the vertical transfer units 202 and 203 are branched to the first horizontal transfer unit 204 and the second horizontal transfer unit 205, and branch transfer is completed.

Subsequently, one branch of the signal charges is horizontally transferred within the first horizontal transfer unit 204 to an output unit (not shown), and the other branch thereof is horizontally transferred within the second horizontal transfer unit 205 to an output unit (not shown).

CITATION LIST

Patent Literature

Patent Literature 1: Japanese Patent Application Laid-Open No. 1-308072
Patent Literature 2: Japanese Patent Application Laid-Open No. 6-319081.

SUMMARY OF INVENTION

Technical Problem

Recently, a full HD moving picture output (1920×1080) at a higher frame rate has been increasingly demanded of cameras using the CCD. In order to meet such a higher frame rate, the horizontal transfer unit needs to be driven at a higher rate. In this case, however, the transfer efficiency of the signal charges is reduced.

Meanwhile, as a first feature of the solid-state imaging device in the related art described in Patent Literature 2 (FIG. 19), different driving pulses are applied to the first electrode element 211A and the second electrode element 211B, respectively, when the signal charges are transferred from the first horizontal transfer unit 204, which are formed by a multilayer gate process to form a four or more layers, to the intermediate transfer unit 206. Thereby, the potential gradient is formed in the first horizontal transfer unit 204 to strengthen a transfer electric field. By reducing a transfer distance to substantially a half, the transfer electric field can be strengthened to suppress the transfer failure of the signal charges.

As a second feature, in the horizontal transfer after the branch transfer is completed, the same driving pulse is applied to the first electrode element 211A and second electrode element 211B formed by the multilayer gate process to form a four or more layers. Thereby, the channel potential is the same under the electrode element 211A and the electrode element 211B in the first horizontal transfer unit 204, and the two electrode elements 211A and 211B corporate and function as one electrode functions. Namely, it is configured so as to form no potential gradient during the horizontal transfer, and reduction in the saturated charge amount in the horizontal transfer unit and horizontal transfer failure described above are suppressed.

Unfortunately, in the configuration in the related art, the potential gradient is inevitably produced. As shown in FIG. 19, the configuration in the related art is a configuration of a two-layer (composite layer) electrode in which the horizontal storage electrode 209 and the horizontal barrier electrode 210 are repeated in the horizontal direction. Further, in order to branch transfer the signal charges in the first horizontal transfer unit 204, the first electrode element 211A and the second electrode element 211B are independently formed. For this reason, the horizontal barrier electrode 210 adjacent to the second electrode element 211B needs to be formed on the first electrode element 211A and the second electrode element 211B. Accordingly, the electrode structure has a three-layer structure.

Meanwhile, in the process to form a composite layer electrode, diffusion of impurities due to increase in the number of a heat treatment cannot be avoided, and distribution of impurities is difficult to control. Additionally, it is extremely difficult to form an insulating film having the same thickness under the respective electrodes, causing a difference in the thickness of the insulating film. FIGS. 22A to 22D are schematic views showing ordinary steps when a composite layered transfer electrode such as the solid-state imaging device in the related art is formed. First, as shown in FIG. 22A, a p type well 222 is formed within an n type semiconductor substrate 221, and an n type diffusion layer 223 in a transfer channel is formed on the surface of the n type semiconductor substrate 221. Next, as shown in FIG. 22B, an insulating film 224 is formed on the n type diffusion layer 223 using one or both of thermal oxidation and thermal CVD. Subsequently, a polycrystalline silicon film is formed on the insulating film 224 by low pressure CVD, and a resist pattern 227 is formed by photolithography in a predetermined region in which a first transfer electrode 225 is formed. Next, as shown in FIG. 22C, using the resist pattern 227 as a mask, a portion in a region 228 is dry etched until the insulating film 224 is completely exposed. During the dry etching, the surface of the insulating film 224 is also etched. As a result, the thickness of an insulating film 229 under the region 228 to be etched is undesirably made smaller than the thickness of an insulating film 230 under the transfer electrode 225. Subsequently, the resist pattern 227 is removed to form the transfer electrode 225. Next, as shown in FIG. 22D, an insulating film 231 and a second transfer electrode 226 are formed. As above, in the process to form a composite layer electrode, a difference is inevitably produced between the thickness of the insulating film 230 under the first transfer electrode 225 and the thickness of the insulating film 230 under the second transfer electrode 226. Thus, when the thickness of the insulating film provided under the transfer electrodes varies for each transfer electrode and the same voltage is applied to the respective transfer electrodes, the potentials under the transfer electrodes are different from each other and not equal even if the concentration of impurities in the n type diffusion layer in the transfer channel is the same. Namely, as in the structure in the related art, when the electrodes are independently formed in the first horizontal transfer unit 204 as the first electrode element 211A and the second electrode element 211B, the potential gradient is undesirably formed. As a result, reduction in the saturated charge amount in the horizontal transfer unit and horizontal transfer failure as described above are produced.

Further, the configuration in the related art insufficiently demonstrates the effect in the CCD formed of a cell having a small pixel size in which the number of pixels is 10 M or more, causing the transfer failure.

The horizontal transfer electrode having the configuration in the related art uses a two-phase drive system as in FIG. 19 in which two electrodes of the storage electrode and the barrier electrode are formed per pixel. This increases the number of gate layers from three layers to four layers, and complicates the process. When the pixel size is small, the horizontal length of the electrode is short. Accordingly, in order to ensure a necessary saturated charge amount, the horizontal transfer unit needs to be designed to have a wider width in the two-phase drive system.

For example, when the pixel size is approximately 5.0 µm and relatively large, the width of the horizontal transfer unit to ensure the necessary saturated charge amount may be approximately 10 to 20 µm. When the pixel size is approximately 1.5 µm, the width of the horizontal transfer unit needs to be approximately 40 to 50 µm.

In FIG. 19, the width of the first horizontal transfer unit 204 in the vertical direction is greatly enlarged. As a result, the transfer distance from the first horizontal transfer unit 204 to the second horizontal transfer unit 205 is extremely increased. Even if different transfer pulses are applied to the first electrode element 211A and the second electrode element 211B during the transfer from the first horizontal transfer unit 204 to the second horizontal transfer unit 205, the transfer electric field becomes extremely weak in the vicinity of the center portion of the first electrode element 211A and in the vicinity of the center portion of the second electrode element 2116 because the transfer distance is long.

For this reason, part of the signal charges remains, causing the transfer failure. Even if the horizontal driving voltage is increased to strengthen the transfer electric field, the electric field can be strengthened in end portions of the respective electrodes, but little effect is produced on the electric field in the vicinity of the center portion of the electrode because the electrode length is long.

In this case, increase in the horizontal driving voltage leads to dramatic increase in the electricity consumption. Moreover, the number of independent electrodes can be further increased within the first horizontal transfer unit 204, and the transfer distance per electrode can be shortened to suppress the transfer failure. This method, however, has a defect such as increase in the number of terminals to be controlled.

The present invention aims at solving the problems in the related art, and an object of the present invention is to provide a solid-state imaging device in which transfer failure of signal charges is suppressed.

Solution to Problem

In order to achieve the object above, a solid-state imaging device according one embodiment of the present invention is a solid-state imaging device comprising: a plurality of photoelectric conversion units two-dimensionally arranged; a plurality of vertical transfer units, each of which is provided for a corresponding one of columns of the photoelectric conversion units, has a plurality of vertical transfer electrodes, and is configured to vertically transfer signal charges read from the photoelectric conversion units; a plurality of horizontal transfer units, each of which has a plurality of horizontal transfer electrodes, and is configured to horizontally transfer the signal charges transferred from the vertical transfer unit; and an intermediate transfer unit provided between the plurality of horizontal transfer units, having a branch transfer electrode, and configured to transfer the signal charges between the plurality of horizontal transfer units, wherein each of the horizontal transfer units includes a first horizontal transfer unit configured to receive the signal charges from the vertical transfer unit, and a second horizontal transfer unit configured to receive the signal charges from the first horizontal transfer unit, in the first horizontal transfer unit, one of the horizontal transfer electrodes includes a plurality of column direction electrodes that are disposed adjacent to one another in the vertical direction and transfer the signal charges via the intermediate transfer unit to the second horizontal transfer unit, and the plurality of vertical transfer electrodes, the plurality of horizontal transfer electrodes, and the branch transfer electrode are a single layer electrode.

According to the configuration, the signal charges are transferred by one column of the horizontal transfer electrode. Thereby, the transfer path can be shortened, and an unnecessary transfer operation can be eliminated. Accordingly, also in a solid-state imaging device having a small pixel size, the transfer failure of signal charges can be suppressed. Moreover, the horizontal transfer electrode is a single layer electrode. Accordingly, the configuration of the electrode is simple, and short circuit between the electrodes can be suppressed.

Here, each of the column direction electrodes may have a rectangular shape in which a horizontal length on a side of the vertical transfer unit is equal to a horizontal length on a side of the intermediate transfer unit.

Moreover, each of the column direction electrodes may be formed to have a horizontal length on the side of the vertical transfer unit shorter than a horizontal length on the side of the intermediate transfer unit.

According to the configuration, the horizontal length of the first horizontal transfer electrode on the side of the first vertical transfer unit is shortened. Thereby, when the signal charges are transferred from the first horizontal transfer unit to the intermediate transfer unit and the second horizontal transfer unit 4, a narrow channel effect can be enhanced, a potential gradient can be formed such that the potential on the side of the intermediate transfer unit is deep, and the transfer electric field can be further strengthened.

Here, each of the column direction electrodes may be formed to have a predetermined angle in the horizontal direction at an interface between the column direction electrodes.

Moreover, the second horizontal transfer unit may include the column direction electrode having the same configuration of the column direction electrode in the first horizontal transfer unit.

According to the configuration, the signal charges can be efficiently transferred, and the transfer failure of signal charges can be further suppressed.

Here, each of the horizontal transfer units may include three or more horizontal transfer electrodes to which three or more phases of a transfer pulse are applied, the three or more phases of a transfer pulse forming one transfer packet.

According to the configuration, the signal charges are transferred by one column of the horizontal transfer electrode among the three or more horizontal transfer electrodes. Thereby, the transfer path can be shortened, and an unnecessary transfer operation can be eliminated. Accordingly, also in a solid-state imaging device having a small pixel size, the transfer failure of signal charges can be suppressed. Moreover, the signal charges are horizontally transferred by three or more phase drive using three or more horizontal transfer electrodes. Accordingly, no horizontal barrier electrode needs to be provided. Thereby, the signal charges can be transferred at a low amplitude voltage, preventing increase in electricity consumption of the solid-state imaging device.

Here, the solid-state imaging device may include a transfer control unit configured to select one of the vertical transfer units that transfers the signal charges to the horizontal transfer unit corresponding to the selected vertical transfer unit, wherein each of the horizontal transfer units has three or more horizontal transfer electrodes to which three or more phases of a transfer pulse is applied, the three or more phases of a transfer pulse forming one transfer packet.

According to the configuration, the signal charges are transferred by one column of the horizontal transfer electrode among three or more horizontal transfer electrodes. Thereby, the transfer path can be shortened, and an unnecessary transfer operation can be eliminated. Moreover, the number of terminals in a package can be reduced. Further, inter-electrode capacitance can be reduced. Low electricity consumption can be attained when the horizontal driving voltage is the same.

Here, the vertical transfer unit may include a plurality of first vertical transfer units, each of which is provided for a corresponding one of columns of the photoelectric conversion units and is configured to transfer the signal charges from the corresponding column of the photoelectric conversion units; and a second vertical transfer unit provided adjacent to the first vertical transfer units in the vertical direction and including a horizontal series of m columns of the first vertical transfer unit, m being an integer of 2 or more.

According to the configuration, m columns of the first vertical transfer unit are connected to the second vertical transfer unit. Thereby, the signal charges are sequentially transferred in unit of m columns to the first horizontal transfer unit. Thereby, the transfer path can be shortened, and an unnecessary transfer operation can be eliminated. Accordingly, also in a solid-state imaging device having a small pixel size, the transfer failure of signal charges can be suppressed.

Here, one end of the second vertical transfer unit connected to the first vertical transfer unit and other end of the second vertical transfer unit on a side opposite to the first vertical transfer unit may be provided continuously with a portion of the first horizontal transfer unit corresponding to a position of the column direction electrode in the first horizontal transfer unit.

According to the configuration, the second vertical transfer unit is provided continuously with the portion of the first horizontal transfer unit corresponding to the position of the column direction electrode. Accordingly, the transfer path of the signal charges can be further shortened, and an unnecessary transfer operation can be eliminated. Accordingly, also in a solid-state imaging device having a small pixel size, the transfer failure of signal charges can be suppressed.

Here, the plurality of column direction electrodes may be independently provided in a position not corresponding to a position of any of the plurality of vertical transfer units.

According to the configuration, the column direction electrode is independently provided in a position not corresponding to any of the plurality of vertical transfer units. Thereby, the signal charges are not directly transferred from the vertical transfer unit to the first horizontal transfer unit under the column direction electrode, and transfer by mistake of the signal charges from the first horizontal transfer unit to the second horizontal transfer unit can be prevented.

Here, each of the horizontal transfer units may be composed of a repeating set of four horizontal transfer electrodes to which four phases of a transfer pulse are applied, the four phases of a transfer pulse forming one transfer packet, and the horizontal transfer electrode in the first horizontal transfer unit may be two-phase shifted from the horizontal transfer electrode in the second horizontal transfer unit in the horizontal direction, and the horizontal transfer electrode in the first horizontal transfer unit and the horizontal transfer electrode in the second horizontal transfer unit may be commonly wired.

According to the configuration, the signal charges are transferred by one column of the horizontal transfer electrode among four or more horizontal transfer electrodes. Thereby, the transfer path can be shortened, and an unnecessary transfer operation can be eliminated. Moreover, the signal charges are horizontally transferred by four- or more phase drive using four or more horizontal transfer electrodes. Accordingly, no horizontal barrier electrode needs to be provided. Thereby, the signal charges can be transferred at a low amplitude voltage, preventing increase in electricity consumption of the solid-state imaging device.

Moreover, in order to achieve the object above, a method of driving a solid-state imaging device according to one embodiment of the present invention is a method of driving a solid-state imaging device, wherein the solid-state imaging device includes: a plurality of photoelectric conversion units two-dimensionally arranged; a plurality of vertical transfer units, each of which is provided for a corresponding one of columns of the photoelectric conversion units, and configured to vertically transfer signal charges read from the photoelectric conversion unit; a plurality of horizontal transfer units, each of which has a plurality of horizontal transfer electrodes, and is configured to horizontally transfer the signal charges from the vertical transfer unit, the vertical transfer units being disposed in parallel in the vertical direction; and an intermediate transfer unit provided between the plurality of horizontal transfer units, and configured to transfer the signal charges between the plurality of horizontal transfer units, and each of the horizontal transfer units includes a first horizontal transfer unit configured to receive the signal charges from the vertical transfer unit, and a second horizontal transfer unit configured to receive the signal charges from the first horizontal transfer unit, and in the first horizontal transfer unit, one of the horizontal transfer electrodes includes a plurality of column direction electrodes that are disposed adjacent to one another in the vertical direction, and transfer the signal charges via the intermediate transfer unit to the second horizontal transfer unit, the method comprising: applying different transfer pulses to the plurality of column direction electrodes to form a potential gradient in the vertical direction, when the signal charges are transferred between the plurality of horizontal transfer units; and applying the same transfer pulse to the plurality of column direction electrodes to equalize a potential in the vertical direction, when the signal charges are horizontally transferred in the horizontal transfer unit.

According to the configuration, a potential gradient can be provided within the horizontal transfer unit by applying different transfer pulses to the plurality of column direction electrodes. Thereby, the signal charges can be easily transferred. Thereby, the transfer failure of signal charges can be suppressed.

Moreover, the present invention not only can be realized as a solid-state imaging device, but also may be realized as a camera including the solid-state imaging device above.

According to the configuration, a camera having the features of the solid-state imaging device can be provided.

Advantageous Effects of Invention

The solid-state imaging device according to the present invention can suppress the transfer failure of signal charges.

BRIEF DESCRIPTION OF DRAWINGS

These and other objects, advantages and features of the invention will become apparent from the following description thereof taken in conjunction with the accompanying drawings that illustrate a specific embodiment of the present invention. In the Drawings:

FIG. 38 is a timing chart showing a driving timing in the normal mode in the first embodiment of the present invention;

FIG. 18A is a diagram showing transfer of signal charges in the sixth embodiment of the present invention;

FIG. 18B is a diagram showing transfer of signal charges in the sixth embodiment of the present invention;

DESCRIPTION OF EMBODIMENTS

Hereinafter, embodiments according to the present invention will be described with reference to the drawings. While the present invention will be described using the embodiments and the accompanying drawings, the description is illustrative of the invention and it is not intended to limit the invention thereto.

Embodiment 1

A solid-state imaging device according to a first embodiment of the present invention will be described. In the present embodiment, a solid-state imaging device will be described, the solid-state imaging device including: a plurality of photoelectric conversion units two-dimensionally arranged; a plurality of vertical transfer units, each of which is provided for a corresponding one of columns of the photoelectric conversion units, has a plurality of vertical transfer electrodes, and vertically transfers the signal charges read from the photoelectric conversion units; a plurality of horizontal transfer units, each of which has a plurality of horizontal transfer electrodes, and horizontally transfers the signal charges transferred from the vertical transfer unit; and an intermediate transfer unit provided between the plurality of horizontal transfer units, having a branch transfer electrode, and transferring the signal charges between the plurality of horizontal transfer units; wherein the plurality of horizontal transfer units each has a first horizontal transfer unit that receives the signal charges from the vertical transfer unit, and the second horizontal transfer unit that receives the signal charges from the first horizontal transfer unit; in the first horizontal transfer unit, one of the horizontal transfer electrodes includes a plurality of column direction electrodes that are disposed adjacent to one another in the vertical direction and transfer the signal charges via the intermediate transfer unit to the second horizontal transfer unit; and the plurality of vertical transfer electrodes, the plurality of horizontal transfer electrode, and the branch transfer electrode are a single layer electrode. The thus-configured solid-state imaging device can suppress the transfer failure of signal charges.

Figure 1:
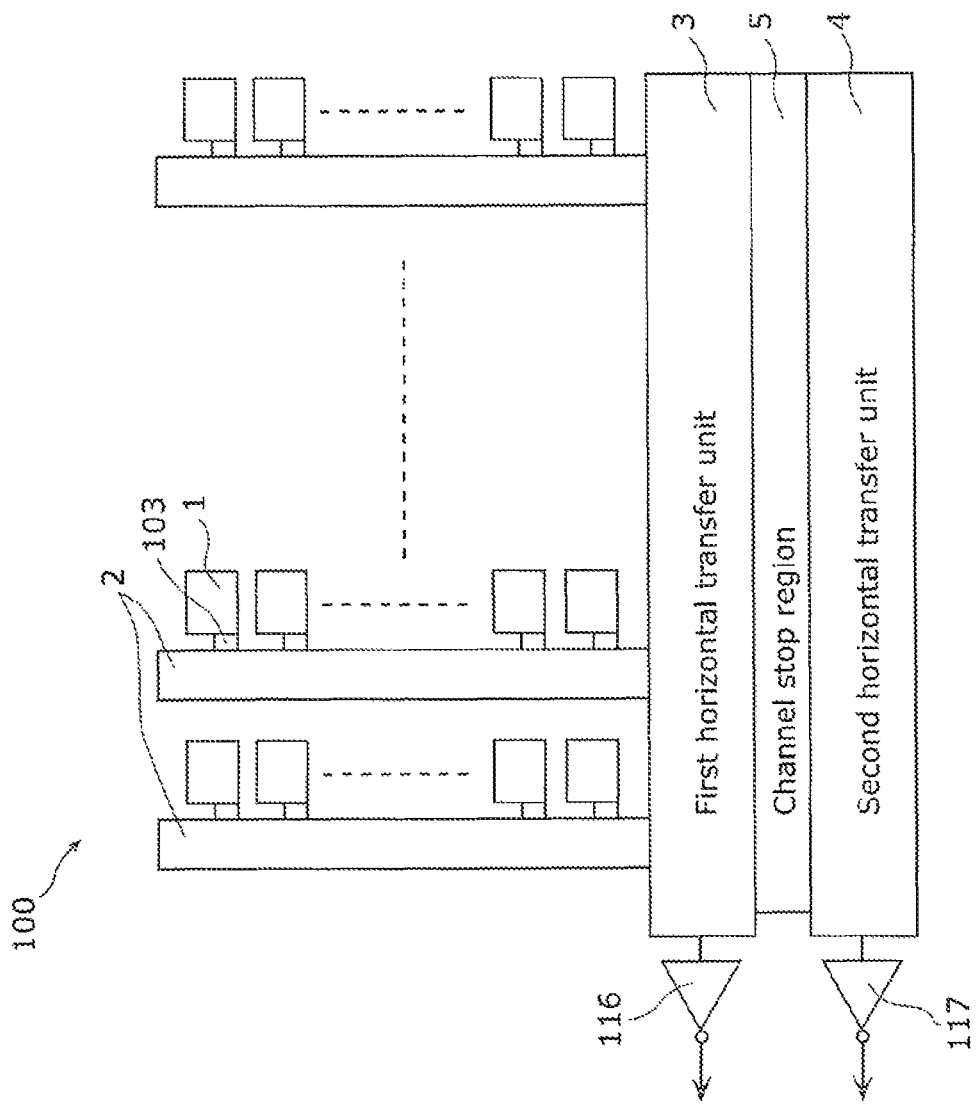
FIG. 1 is a schematic configuration diagram of a solid-state imaging device according to a first embodiment of the present invention.

FIG. 1 is a schematic configuration diagram showing a configuration of a solid-state imaging device 100 according to the first embodiment of the present invention.

As shown in FIG. 1, the solid-state imaging device 100 includes a photoelectric conversion unit 1, a signal charges read unit 103, a first vertical transfer unit 2, a first horizontal transfer unit 3, a second horizontal transfer unit 4, a channel stop region 5, a first signal charge output unit 116, and a second signal charge output unit 117.

Figure 2A:
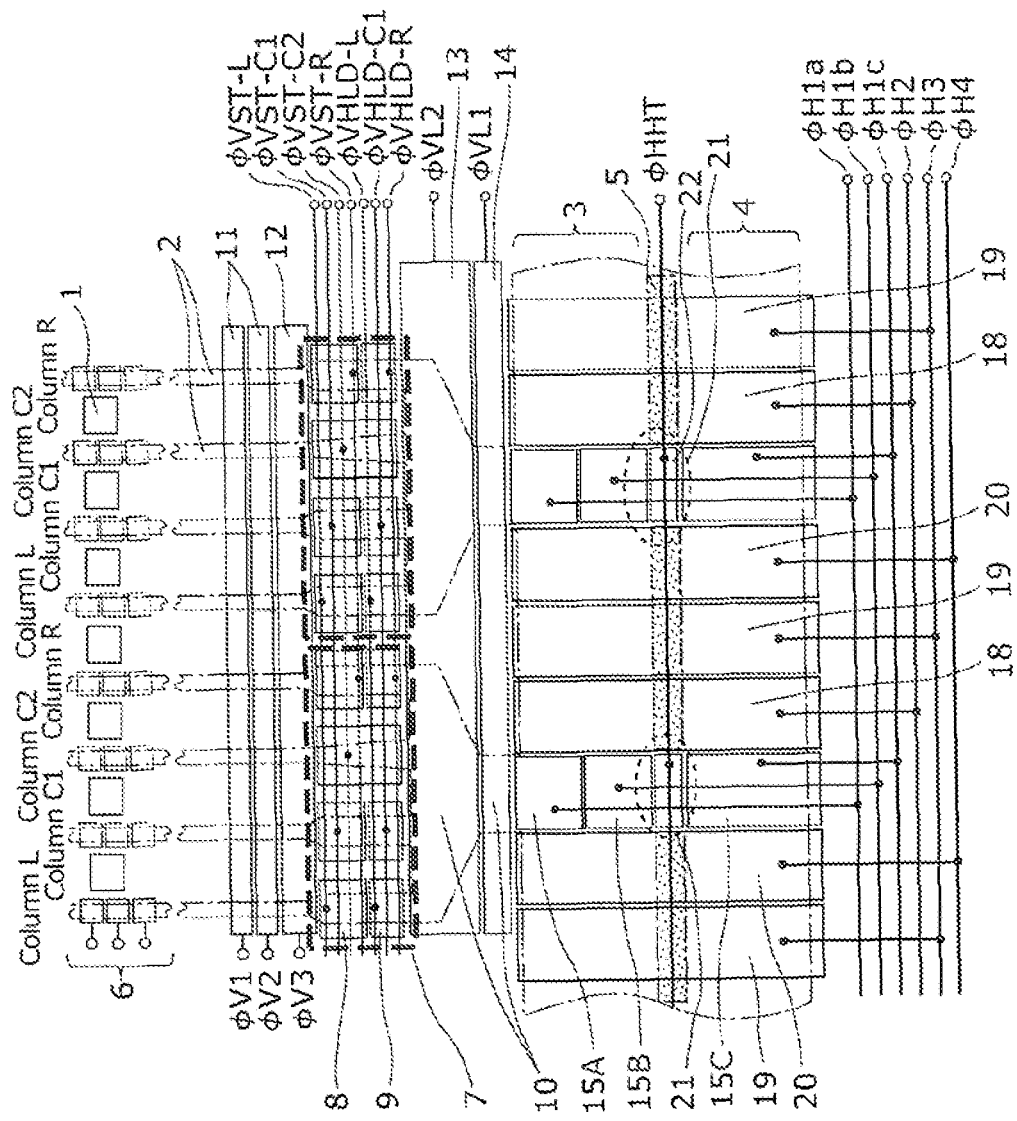
FIG. 2A is a detailed configuration diagram of the solid-state imaging device according to the first embodiment of the present invention.

FIG. 2A is a detailed configuration diagram of the solid-state imaging device 100 according to the first embodiment of the present invention.

As shown in FIG. 2A, the solid-state imaging device 100 specifically includes the photoelectric conversion unit 1, the first vertical transfer unit 2, a pixel repeat unit 6, a vertical transfer electrode 11, an intermediate electrode 12, a transfer control unit 7 having a signal charge storage electrode 8 and a transfer preventing electrode 9, a second vertical transfer unit 10, a transfer electrode 13 in the second vertical transfer unit 10, a final vertical transfer electrode 14, the first horizontal transfer unit 3, the second horizontal transfer unit 4, the channel stop region 5, an intermediate transfer unit 21, a branch transfer electrode 22 provided on the intermediate transfer unit 21, first horizontal transfer electrodes 15A and 15B provided in the first horizontal transfer unit 3, a first horizontal transfer electrode 15C provided in the second horizontal transfer unit 4, a plurality of second horizontal transfer electrodes 18, a plurality of third horizontal transfer electrodes 19, and a plurality of fourth horizontal transfer electrodes 20, which are provided in the first horizontal transfer unit 3 and the second horizontal transfer unit 4, respectively. The channel stop region 5 is formed in a region between the first horizontal transfer unit 3 and the second horizontal transfer unit 4 in which the intermediate transfer unit 21 is not formed. Here, the transfer electrode 13 and the final vertical transfer electrode 14 correspond to the vertical transfer electrode in the present embodiment. The first horizontal transfer electrodes 15A, 15B, and 15C, the second horizontal transfer electrode 18, the third horizontal transfer electrode 19, and the fourth horizontal transfer electrode 20 correspond to the horizontal transfer electrode in the present embodiment.

The first horizontal transfer electrodes 15A and 15B correspond to the column direction electrode in the present embodiment. In the present embodiment, the first horizontal transfer electrodes 15A and 15B are formed such that the horizontal length on the side of the second vertical transfer unit 10 is equal to the horizontal length on the side of the intermediate transfer unit 21. The first vertical transfer unit 2, the second vertical transfer unit 10, the first horizontal transfer unit 3, and the second horizontal transfer unit 4 are continuously formed, and shown by a dot-dash line in the FIG. 2A. These are shown in the same manner in the drawings other than FIG. 2A. In FIG. 2A, the vertical transfer electrode, the horizontal transfer electrode, and the branch transfer electrode are all a single layer electrode. The branch transfer electrode 22 is independently formed. Alternatively, as shown in FIG. 2B, the branch transfer electrode 22 may be formed on the intermediate transfer unit 21 integrally with the channel stop region 5 and the intermediate transfer unit 21, unlike the branch transfer electrode 22 shown in FIG. 2A in which the branch transfer electrode 22 is separately provided for each intermediate transfer unit 21.

Figure 2B:
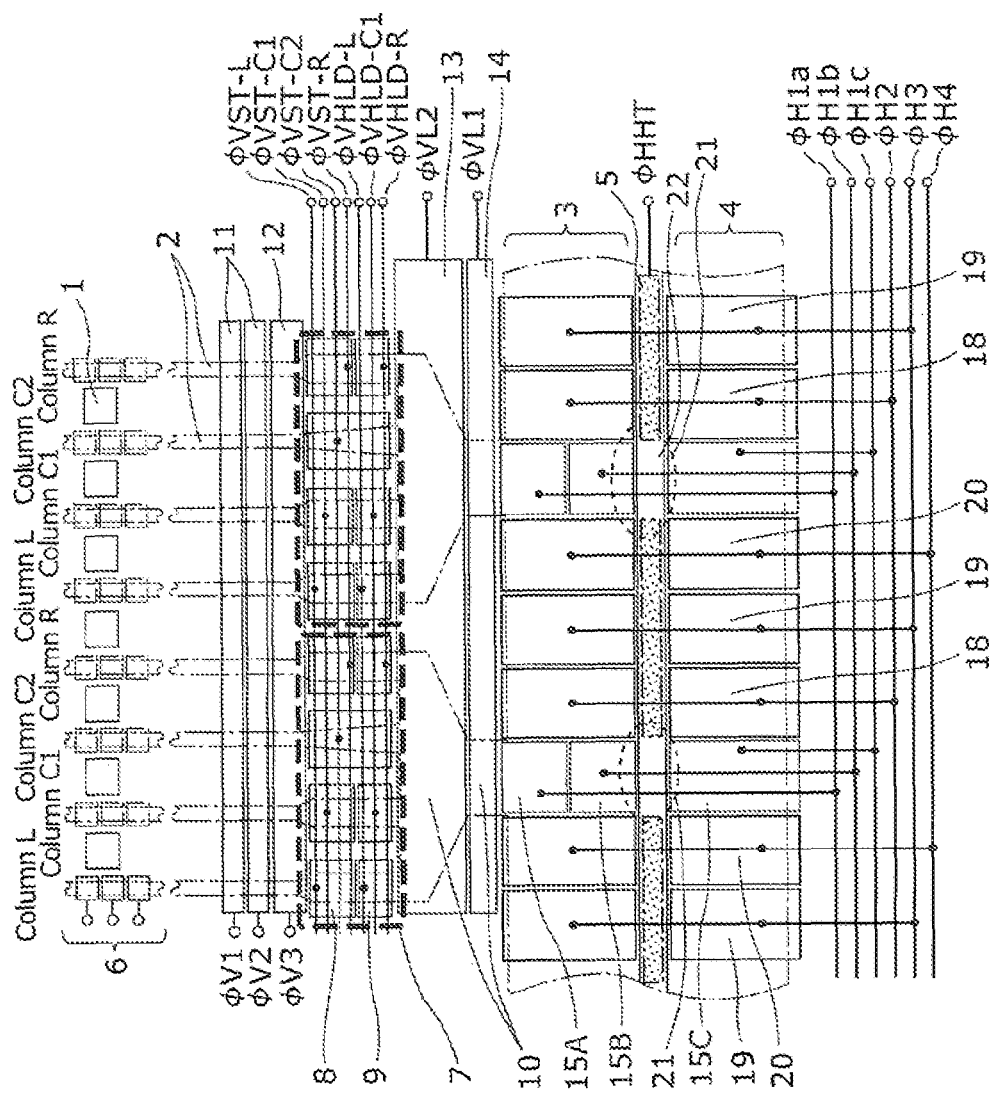
FIG. 2B is a detailed configuration diagram of the solid-state imaging device according to the first embodiment of the present invention.

Namely, in FIG. 2B, the horizontal transfer electrode in the first horizontal transfer unit 3 is independent from that in the second horizontal transfer unit 4. In this case, the channel stop region 5 is not formed under the branch transfer electrode 22 because the intermediate transfer unit 21 is allowed to vertically transfer the signal charges in the first horizontal transfer unit 3 to the horizontal transfer unit 4. Alternatively, without forming the channel stop region 5 under the branch transfer electrode 22, the potential under the intermediate transfer unit 21 can be deepened to transfer the charges from the first horizontal transfer unit 3 to the second horizontal transfer unit 4 (not shown).

As shown in FIG. 1 and FIG. 2A, the solid-state imaging device 100 reads the signal charges generated in the photoelectric conversion unit 1 via the read unit 103 to the first vertical transfer unit 2 by the vertical transfer electrode 11. Subsequently, the signal charges within the first vertical transfer unit 2 are sequentially transferred to the first horizontal transfer unit 3. Subsequently, by applying voltage to the intermediate transfer unit 21 provided between the first horizontal transfer unit 3 and the second horizontal transfer unit 4, the signal charges are transferred from the first horizontal transfer unit 3 to the second horizontal transfer unit 4.

Next, the signal charges in the next line are transferred from the first vertical transfer unit 2 to the first horizontal transfer unit 3 and the second horizontal transfer unit 4. Subsequently, the signal charges in the first horizontal transfer unit 3 and the signal charges in the second horizontal transfer unit 4 are simultaneously transferred in the horizontal direction. The signal charges in the first horizontal transfer unit 3 are detected in the first signal charge output unit 116, and converted to a signal voltage; and the signal charges in the second horizontal transfer unit 4 are detected in the second signal charge output unit 117, and converted to a signal voltage. Thus, the signals corresponding to two lines are output.

As above, according to the configuration of the first horizontal transfer unit 3 and the second horizontal transfer unit 4 disposed in parallel, the signal charges can be simultaneously output by two lines, providing high-speed drive.

Here, usually, in the solid-state imaging device, one transfer packet of the horizontal transfer unit is provided for one column of the vertical transfer unit. Moreover, two horizontal transfer electrodes are provided for one column of the vertical transfer unit when the horizontal transfer unit is two-phase driven, and three horizontal transfer electrodes are provided for one column of the vertical transfer unit when the horizontal transfer unit is three-phase driven.

In contrast, in the present invention, the first horizontal transfer unit 3 and the second horizontal transfer unit 4 are three or more phase driven, and composed of three or more horizontal transfer electrodes. Particularly in the configuration of the present embodiment, the horizontal transfer unit is four-phase driven, and four columns of the horizontal transfer electrode are repeatedly arranged in the first horizontal transfer unit 3 and the second horizontal transfer unit 4.

Moreover, one transfer packet is provided for four columns of the first vertical transfer unit 2, unlike the related art in which one transfer packet is provided for one column of the vertical transfer unit. Accordingly, unlike the related art, the number of transfer packets provided for the first horizontal transfer unit 3 and the second horizontal transfer unit 4 is not equal to the number of the first vertical transfer unit 2, and is ¼ for one column of the first vertical transfer unit 2. In a normal mode, transfer from the first vertical transfer unit 2 to the first horizontal transfer unit 3 and the second horizontal transfer unit 4, and the transfer operation from the first horizontal transfer unit 3 to the first signal charge output unit 116 and from the second horizontal transfer unit 4 to the second signal charge output unit 117 are divided into four and performed. Thereby, the signal charges in one line are divided and output by interlaced output (details of the operation will be described later). Thus, the number of electrodes in the first horizontal transfer unit 3 and the second horizontal transfer unit 4 can be reduced, and the inter-electrode capacitance can be reduced, resulting in low electricity consumption.

When the signal charges are added in horizontal interlace or a moving picture mode, an operation to temporarily hold the signal charges is needed. In the present embodiment, in the transfer control unit 7 in FIG. 2A, transfer of the signal charges can be selectively controlled by the signal charge storage electrode 8 and the transfer preventing electrode 9 provided in each column.

The transfer control unit 7 is repeated in the horizontal direction in a unit of four columns of Column L, Column C1, Column C2, and Column R. The first horizontal transfer unit 3 and the second horizontal transfer unit 4 are four-phase driven. In FIG. 2A, one transfer packet is formed in the first horizontal transfer unit 3 by four columns of the horizontal transfer electrode, which are a column of the first horizontal transfer electrodes 15A and 15B, the second horizontal transfer electrode 18, the third horizontal transfer electrode 19, and the fourth horizontal transfer electrode 20. One transfer packet is formed in the second horizontal transfer unit 4 by four columns of the horizontal transfer electrode, which are the first horizontal transfer electrode 15C, the second horizontal transfer electrode 18, the third horizontal transfer electrode 19, and the fourth horizontal transfer electrode 20. Namely, it is configured that the four columns of the horizontal transfer electrode that form one transfer packet correspond to the four columns that form the transfer control unit 7.

As shown in FIG. 2A, in the configuration of the transfer control unit 7, each of Column L, Column C1, and Column R has two electrodes of the signal charge storage electrode 8 and the transfer preventing electrode 9 while Column C2 may have only one electrode instead of the two electrodes. This is because control of the signal charges is unnecessary in Column C2 in which the signal charges are always first transferred among the signal charges in the four columns of the first vertical transfer unit 2, and the same transfer pulse as that applied to the vertical transfer electrode in the pixel repeat unit 6 can be applied to the transfer electrode in Column C2 in the transfer control unit 7. Thereby, the number of independent electrodes within the transfer control unit 7 can be reduced, and the number of terminals in a package can be reduced.

When the signal charges are controlled in Column L, Column C1, or Column R in the transfer control unit 7, the signal charges are held in the first vertical transfer unit 2 provided under the transfer electrode located in the signal charge storage electrode 8. For this reason, the electrode length of the signal charge storage electrode 8 is longer than the electrode length of the vertical transfer electrode in the pixel repeat unit 6 and the width of the first vertical transfer unit 2 located under the signal charge storage electrode 8 is wider than the width of the first vertical transfer unit 2.

Meanwhile, holding of the signal charges is unnecessary in Column C2 in the transfer control unit 7. Accordingly, the width of the first vertical transfer unit 2 in Column C2 may be narrower than the widths of the first vertical transfer units 2 located under the signal charge storage electrodes 8 in Column L, Column C1, and Column R. For this reason, Column C2 in the transfer control unit 7 has the first vertical transfer unit 2 whose width is gradually increased toward the first horizontal transfer unit 3, and uses a narrow channel effect to improve the transfer electric field. Thereby, transfer by a long electrode length is enabled.

As a first feature of the present embodiment, the solid-state imaging device 100 includes the first vertical transfer units 2 each of which is provided corresponding to one column of the photoelectric conversion units 1 and transfers the signal charges from the photoelectric conversion units 1, and the second vertical transfer unit 10 to which a series of the four columns of the first vertical transfer unit 2 are connected. Namely, the four columns of the first vertical transfer unit 2 are collected in the second vertical transfer unit 10, and the second vertical transfer unit 10 is provided continuously with a portion of the first horizontal transfer unit 3 corresponding to the position of one electrode (the first horizontal transfer electrode 15A) among the four horizontal transfer electrodes that form one transfer packet (one column of the first horizontal transfer electrodes 15A and 15B, or 15C, the second horizontal transfer electrode 18, the third horizontal transfer electrode 19, and the fourth horizontal transfer electrode 20).

As shown in FIG. 2A, the first horizontal transfer electrode 15B is provided in the vertical transfer direction of the first horizontal transfer electrode 15A, and the intermediate transfer unit 21 having the branch transfer electrode 22 is provided between the first horizontal transfer electrodes 15B and 15C.

Figure 9:
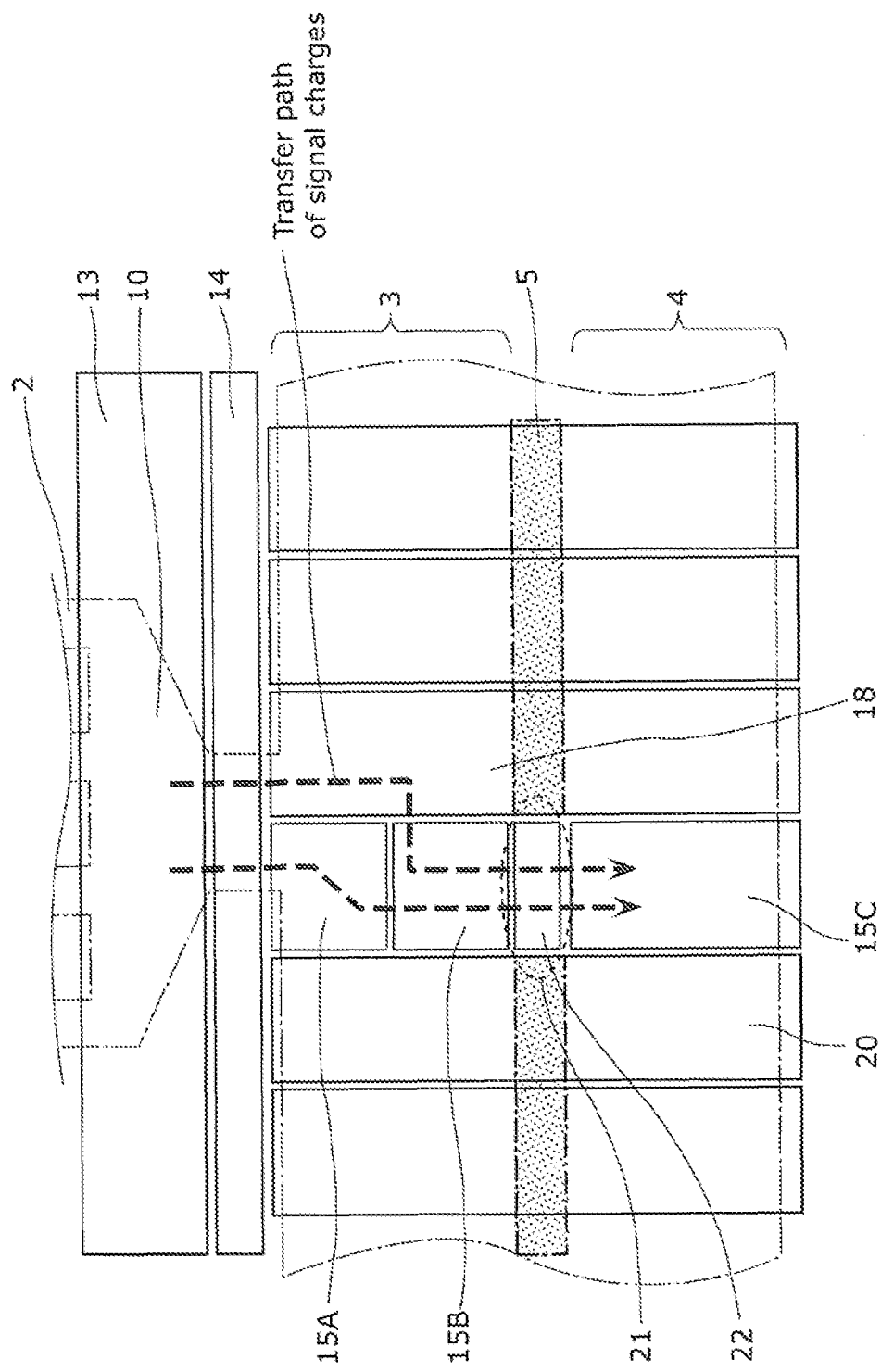
FIG. 9 is a partial configuration diagram of the solid-state imaging device according to the first embodiment of the present invention (a horizontal storage electrode is modified)

In the configuration, the signal charges within the second vertical transfer unit 10 can be transferred to the first horizontal transfer unit 3, and can be transferred via the intermediate transfer unit 21 to the second horizontal transfer unit 4 at the same time. As shown in FIG. 9, in the first horizontal transfer unit 3, a transfer operation to narrow down a plurality of horizontal transfer electrodes provided in the horizontal direction (for example, first horizontal transfer electrodes 15A and 15B, second horizontal transfer electrode 18) to one column of the horizontal transfer electrode (for example, one column of the first horizontal transfer electrodes 15A and 15B) after the plurality of horizontal transfer electrodes receive the signal charges from the second vertical transfer unit 10 is unnecessary, and efficient transfer can be performed. Further, in vertical transfer of the signal charges from the first horizontal transfer unit 3 via the intermediate transfer unit 21 to the second horizontal transfer unit 4, an unnecessary transfer operation is eliminated and an efficient transfer operation can be performed. Accordingly, a longer transfer time can be ensured.

The transfer path of the signal charges from the second vertical transfer unit 10 via the first horizontal transfer unit 3 and the intermediate transfer unit 21 to the second horizontal transfer unit 4 is straight in the vertical direction. Unlike the configuration of the solid-state imaging device in the related art (FIG. 19), the signal charges do not need to be transferred in an oblique direction in the intermediate transfer unit 206. Accordingly, the transfer distance of the signal charges can be shortened, leading to suppression of transfer degradation.

As a second feature of the present embodiment, the transfer electrode for vertically transferring the signal charges from the first horizontal transfer unit 3 to the intermediate transfer unit 21 is formed of a plurality of independent electrodes as the first horizontal transfer electrodes 15A and 15B shown in FIG. 2A, and a single layer electrode. Thereby, different transfer pulses are applied to the first horizontal transfer electrodes 15A and 15B to provide a potential gradient in the vertical direction when the signal charges are transferred between the first horizontal transfer unit 3 and the second horizontal transfer unit 4, and the same transfer pulse is applied to the first horizontal transfer electrodes 15A and 15B to equalize the potential in the vertical direction when the signal charges is horizontally transferred in the first horizontal transfer unit 3. Thus, the signal charges are transferred by the two electrodes when the signal charges are transferred from the first horizontal transfer unit 3 to the intermediate transfer unit 21. Thereby, the transfer distance per electrode can be shortened, and the transfer electric field can be improved, leading to further suppression of transfer failure.

The horizontal two-phase drive in the solid-state imaging device shown in the related art includes a charge storage region under the horizontal storage electrodes 209 and 211 and the barrier region 213. In horizontal transfer, the signal charges need to be transferred beyond the potential barrier of the barrier region, and a relatively high driving voltage (for example, 3.3 to 5.0 V) is necessary. Contrary to this, the horizontal transfer in the solid-state imaging device 100 according to the present embodiment is four-phase driven. Accordingly, no barrier region needs to be formed, and transfer can be performed at a low amplitude voltage (for example, 1.8 V). Also when the signal charges are vertically transferred from the first horizontal transfer unit 3 to the second horizontal transfer unit 4, transfer at a low voltage can be attained because the solid-state imaging device 100 shown in the present embodiment has the structure as above in which the horizontal transfer electrode is composed of the two horizontal transfer electrodes, i.e., the first horizontal transfer electrodes 15A and 15B provided in the horizontal direction, thereby providing a strengthened transfer electric field. Accordingly, the vertical transfer from the first horizontal transfer unit 3 to the second horizontal transfer unit 4 and the horizontal transfer can be performed by low voltage drive, resulting in low electricity consumption.

Figure 19:
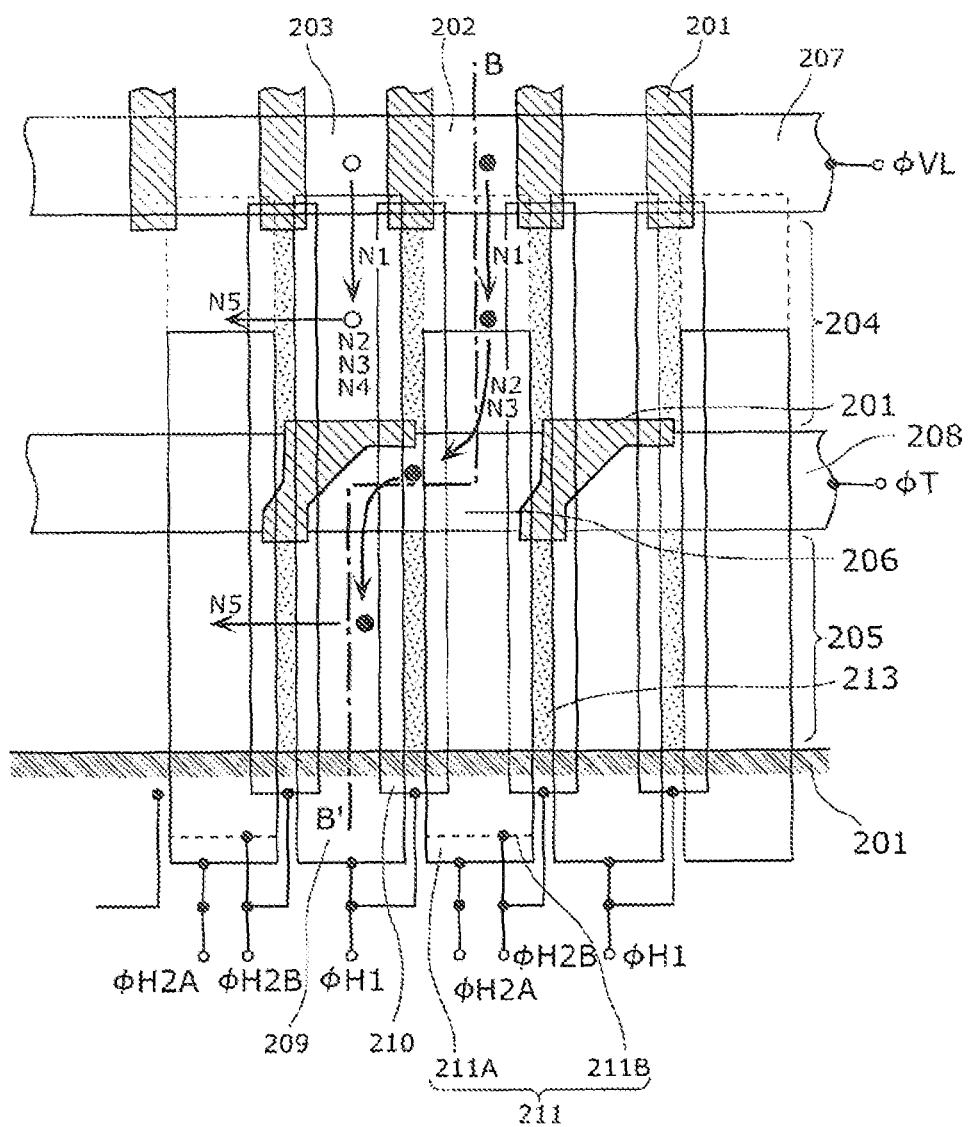
FIG. 19 is a partial configuration diagram of a horizontal transfer unit in a solid-state imaging device in the related art.

Moreover, the horizontal transfer electrode in the solid-state imaging device 100 according to the present embodiment is formed of a single layer while the horizontal transfer electrode in the solid-state imaging device shown in the related art has a configuration of a two-layer (composite layer) electrode as shown in FIG. 19 in which a set of the horizontal storage electrodes 209 and 211 and the horizontal barrier electrode 210 is repeated in the horizontal direction. Further, in the solid-state imaging device shown in the related art, the first electrode element 211A and the second electrode element 211B in the horizontal storage electrode 211 are independently formed in order to branch transfer the signal charges to the first horizontal transfer unit 3 and the second horizontal transfer unit 4. For this reason, the horizontal barrier electrode 210 adjacent to the second electrode element 211B needs to be formed on the first electrode element 211A and the second electrode element 211B. Accordingly, the electrode structure has a three-layer structure. For this reason, as described above, in the structure of the solid-state imaging device in the related art, even if the same voltage is applied to the respective transfer electrodes, the channel potentials under the respective electrodes are different from each other to form a potential gradient. Further, the overlapped transfer electrodes result in a complicate wiring structure, which is likely to cause short circuit between the electrodes. Contrary to this, such problems do not occur in the present embodiment.

The operation of the thus-configured solid-state imaging device 100 will be described below. In the respective electrodes shown in FIG. 2A, shown are transfer pulses φV1, φV2, φV3, φVST-L, φVST-C1, φVST-C2, φVST-R, φVHLD-L, φVHLD-C1, φVST-R, φVL1, φVL2, φHHT, φH1a, φH1b, φH1c, φH2, φH3, and φH4, which are applied to the corresponding electrodes.

Figure 3A:
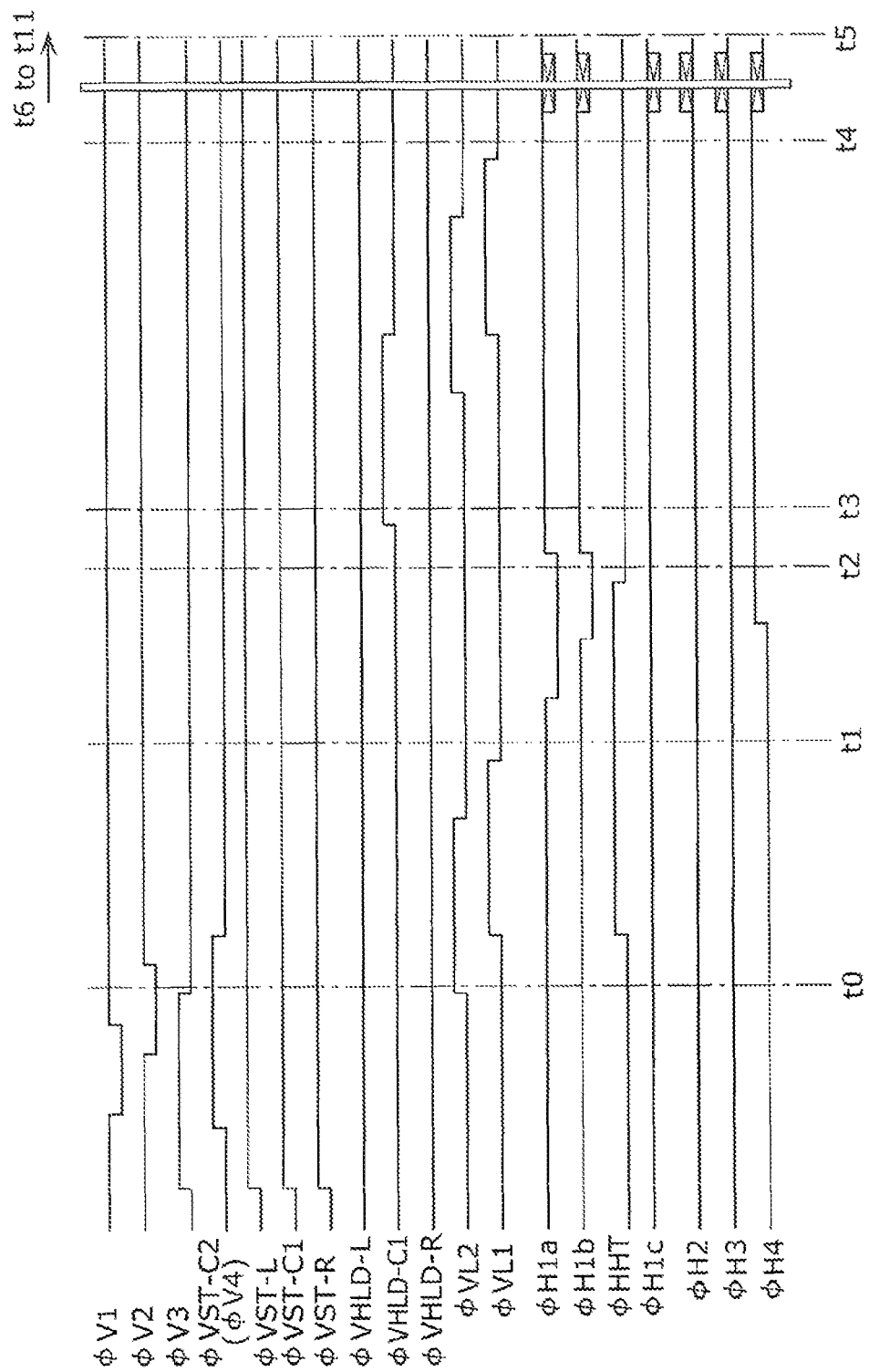
FIG. 3A is a timing chart showing a driving timing in a normal mode in the first embodiment of the present invention.
Figure 3B:
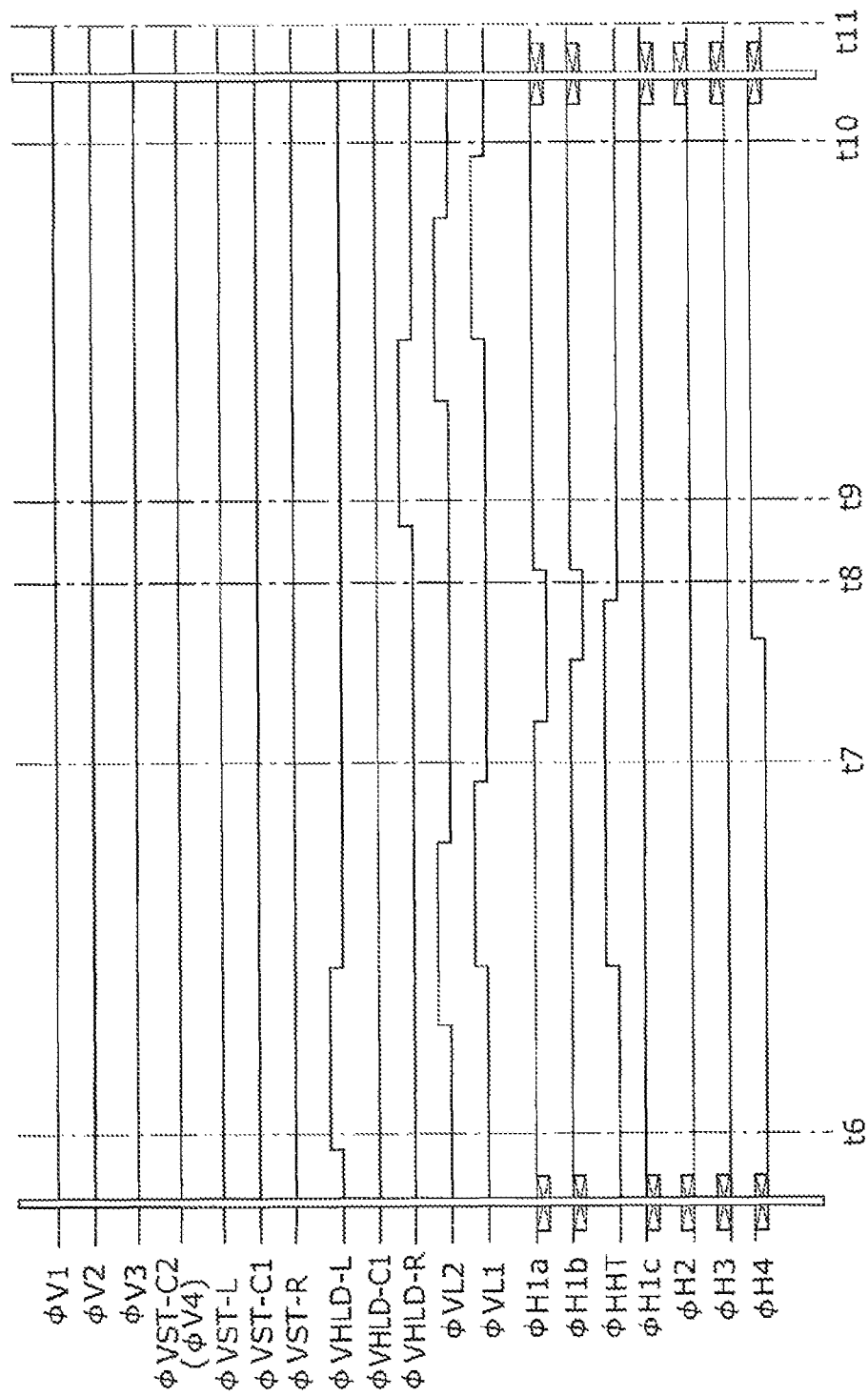

FIG. 3A and FIG. 3B show a driving timing in a normal mode in the present embodiment, and FIG. 4A to FIG. 4E are diagrams showing transfer of signal charges.

As shown in FIG. 4A to FIG. 4E, in the normal mode, the number of packets in the first horizontal transfer unit 3 and the second horizontal transfer unit 4 is ¼ of the number of columns of the first vertical transfer unit 2. Accordingly, the signal charges in Column C2, Column C1, Column L, and Column R are transferred four times in order of Column C2, Column C1, Column L, and Column R from the first vertical transfer unit 2 to the first horizontal transfer unit 3 and from the first horizontal transfer unit 3 via the intermediate transfer unit 21 to the second horizontal transfer unit 4. Subsequently, the signal charges are transferred to the first signal charge output unit 116 and the second signal charge output unit 117. In the present embodiment, a case where the first vertical transfer unit 2 in the pixel repeat unit 6 is four-phase driven is shown. Moreover, in order to describe a case where the signal charges concerning pixels for G and R are transferred, movement of the signal charges in the respective columns are expressed by G and R in FIG. 4A to FIG. 4E.

In FIG. 2A, the signal charges stored in the photoelectric conversion unit 1 are read to the first vertical transfer unit 2, and transferred via the vertical transfer electrode 11 and the intermediate electrode 12 to under the signal charge storage electrode 8 in each of the columns.

Figure 4A:
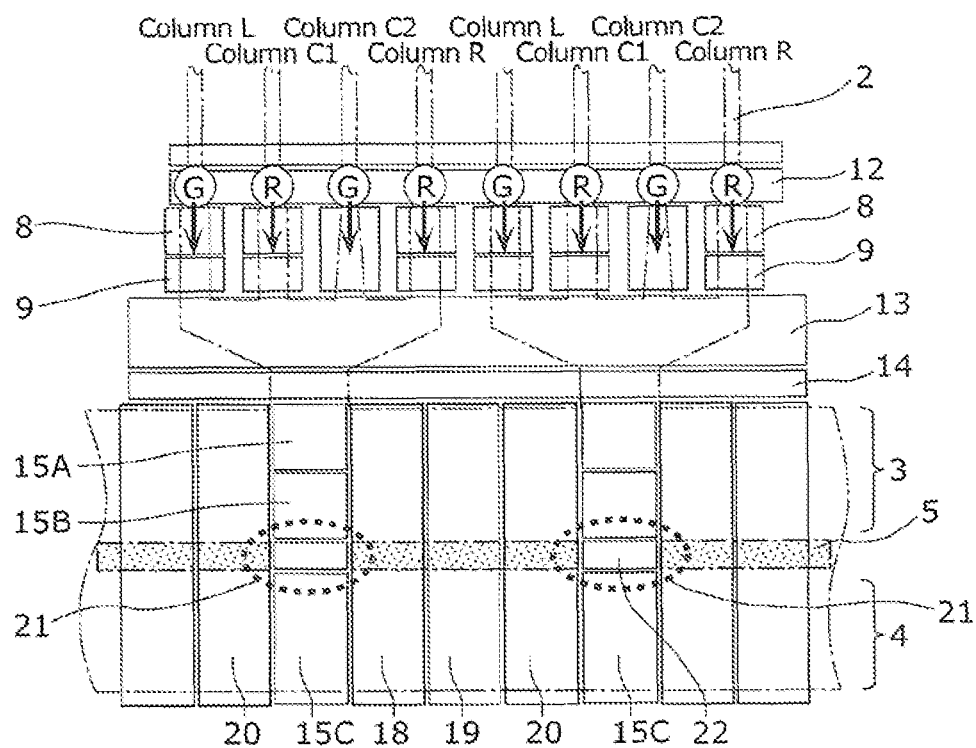
FIG. 4A is a diagram showing transfer of signal charges in the normal mode in the first embodiment of the present invention.

At a time t0 in FIG. 3A, a transfer pulse at a low level (for example, −6 V) as φV3 is applied to the intermediate electrode 12, and a transfer pulse at a middle level (for example, 0 V) is applied to the signal charge storage electrodes 8 in Column L, Column C1, and Column R as φST-L, φVST-C1, and φVST-R, respectively. The same transfer pulse as that applied to the vertical transfer electrode in the pixel repeat unit 6 can be applied to the single transfer electrode in Column C2 in which the signal charge storage electrode 8 and the transfer preventing electrode 9 are integrally formed, as described above. Accordingly, a transfer pulse φV4 at a middle level is applied as φVST-C2. Thereby, the signal charges stored in a transfer region under the intermediate electrode 12 in each of the columns are transferred to a transfer region under the signal charge storage electrode 8 in the corresponding column (FIG. 4A).

Transfer pulses at the low level are applied to the transfer preventing electrodes 9 in Column L, Column C1, and Column R as φVHLD-L, φVHLD-C1, and φVHLD-R, respectively, to form a potential barrier. This prevents transfer of the signal charges to the next stage.

Next, in the period from times t0 to t1, Column C2 is selected from the four columns by the transfer control unit 7, and the signal charges are transferred. In Column L, Column C1, and Column R not selected, the transfer pulses φVHLD- L, φVHLD-C1, and φVHLD-R to be applied to the corresponding transfer preventing electrodes 9 are kept at the low level, and the signal charges in these columns are held in the first vertical transfer units 2 under the signal charge storage electrodes 8. Additionally, the transfer pulse φVST-C2 (φV4) to be applied to the signal charge storage electrode 8 in Column C2, the transfer pulse φVL2 to be applied to the transfer electrode 13 in the second vertical transfer unit 10, and the transfer pulse φVL1 to be applied to the final vertical transfer electrode 14 are changed. At this time, concurrently, the transfer pulses φH1a to be applied to the first horizontal transfer electrode 15A, φH1b to be applied to the first horizontal transfer electrode 15B, and φH1c to be applied to the first horizontal transfer electrode 15C are controlled to be a high level (for example, 1.8 V), and a transfer pulse φHHT at the high level is applied to the branch transfer electrode 22 in the intermediate transfer unit 21. Thereby, the signal charges in Column C2 are transferred to the first horizontal transfer unit 3, the intermediate transfer unit 21, and the second horizontal transfer unit 4.

Figure 4B:
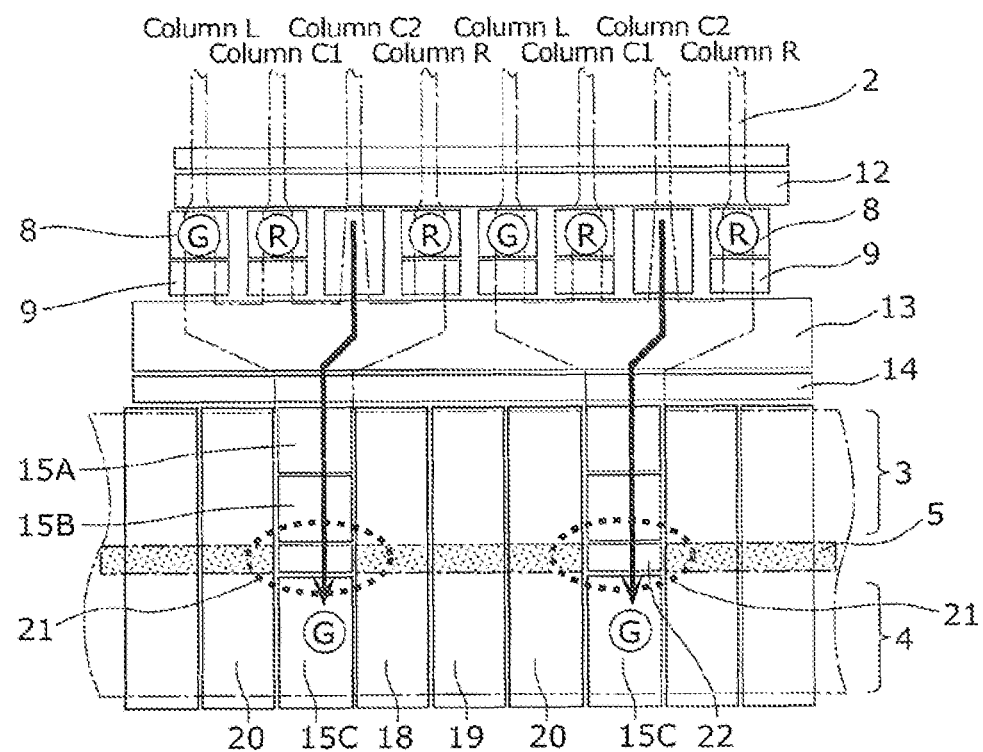
FIG. 4B is a diagram showing transfer of signal charges in the normal mode in the first embodiment of the present invention.

Subsequently, in the period from times t1 to t2, the transfer pulse φH1a to be applied to the first horizontal transfer electrode 15A, the transfer pulse φH1b to be applied to the first horizontal transfer electrode 15B, and the transfer pulse φHHT to be applied to the intermediate transfer unit 21 are changed to complete transfer of the signal charges from the first horizontal transfer unit 3 to the second horizontal transfer unit 4 (FIG. 4B).

Next, in the period from times t2 to t3, Column C1 is selected from the four columns by the transfer control unit 7, and the signal charges are transferred. The transfer pulses φVHLD-L and φVHLD-R to be applied to the transfer preventing electrodes 9 in Column L and Column R not selected are kept at the low level, and the signal charges in Column L and the signal charges in Column R are kept in the corresponding signal charge storage electrodes 8. Additionally, the transfer pulse φVHLD-C1 to be applied to the transfer preventing electrode 9 in Column C1 is changed to the middle level to transfer the signal charges held in the first vertical transfer unit 2 under the signal charge storage electrode 8 in Column C1 to the first vertical transfer unit 2 under the transfer preventing electrode 9.

Subsequently, in the period from times t3 to t4, φVHLD-C1 to be applied to the transfer preventing electrode 9 in Column C1, φVL2 to be applied to the transfer electrode 13 in the second vertical transfer unit 10, and φVL1 to be applied to the final vertical transfer electrode 14 are changed. Additionally, φH1a to be applied to the first horizontal transfer electrode 15A and φH1b to be applied to the first horizontal transfer electrode 15B are controlled to be the high level to transfer the signal charges in Column C1 to the first horizontal transfer unit 3. At this time, the transfer pulse φHHT to be applied to the branch transfer electrode 22 in the intermediate transfer unit 21 is kept at the low level to prevent mixing of the signal charges in the first horizontal transfer unit 3 with those in the second horizontal transfer unit 4.

Figure 4C:
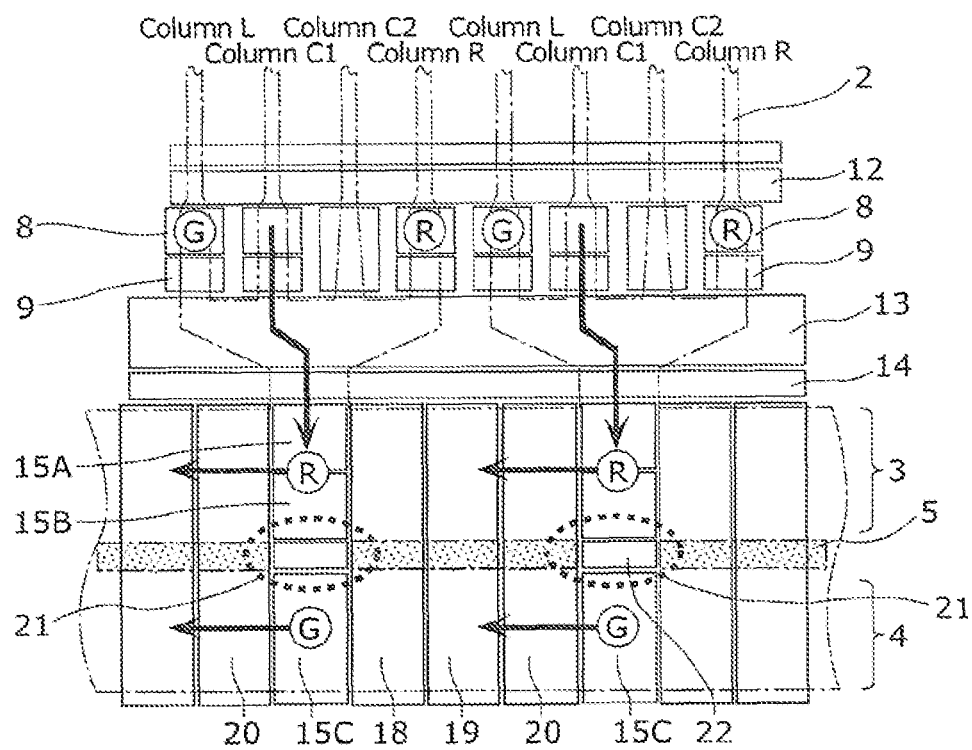
FIG. 4C is a diagram showing transfer of signal charges in the normal mode in the first embodiment of the present invention.

Subsequently, in the period from times t4 to t5, the signal charges in the first horizontal transfer unit 3 and those in the second horizontal transfer unit 4 are transferred to the first signal charge output unit 116 and the second signal charge output unit 117, respectively. Thereby, the signal charges in Column C2 and the signal charges in Column C1 are output (FIG. 4C).

Next, at a time t6 shown in FIG. 3B, Column L is selected from the four columns by the transfer control unit 7, and the signal charges are transferred. In Column R not selected, the transfer pulse φVHLD-R to be applied to the transfer preventing electrode 9 is kept at the low level, and the signal charges in Column R are held in the first vertical transfer unit 2 under the signal charge storage electrode 8. Additionally, the transfer pulse φVHLD-L to be applied to the transfer preventing electrode 9 in Column L is changed to the middle level, and the signal charges held in the first vertical transfer unit 2 under the signal charge storage electrode 8 in Column L are transferred to the first vertical transfer unit 2 under the transfer preventing electrode 9.

Subsequently, in the period from times t6 to t7, the transfer pulses φVHLD-L to be applied to the transfer preventing electrode 9, φVL2 to be applied to the transfer electrode 13 in the second vertical transfer unit 10, and φVL1 to be applied to the final vertical transfer electrode 14 in Column L are changed. Concurrently, φH1a to be applied to the first horizontal transfer electrode 15A, φH1b to be applied to the first horizontal transfer electrode 15B, and φH1c to be applied to the first horizontal transfer electrode 15C are controlled to be the high level (for example, 1.8 V), and the transfer pulse φHHT at the high level is applied to the branch transfer electrode 22 in the intermediate transfer unit 21. Thereby, the signal charges in Column C2 are transferred to the first horizontal transfer unit 3 and the second horizontal transfer unit 4.

Figure 4D:
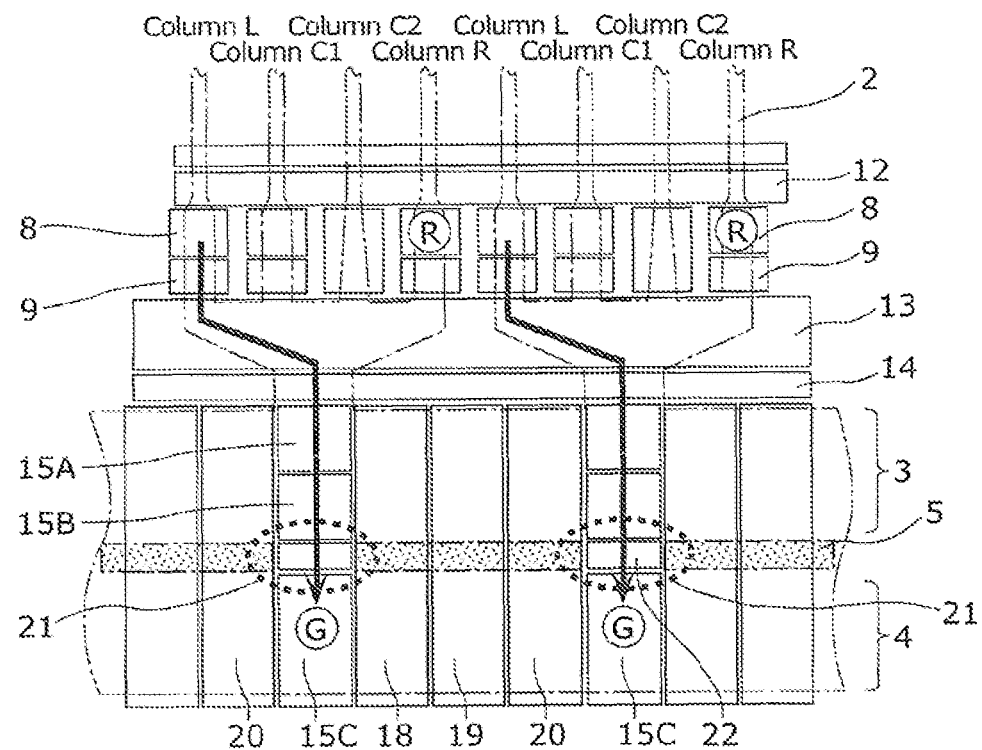
FIG. 4D is a diagram showing transfer of signal charges in the normal mode in the first embodiment of the present invention.

Subsequently, in the period from times t7 to t8, the transfer pulse φH1a is to be applied to the first horizontal transfer electrode 15A, the transfer pulse φH1b to be applied to the first horizontal transfer electrode 15B, and the transfer pulse φHHT to be applied to the branch transfer electrode 22 in the intermediate transfer unit 21 are changed to complete transfer of the signal charges from the first horizontal transfer unit 3 to the second horizontal transfer unit 4 (FIG. 4D).

Subsequently, at a time t9, Column R is selected from the four columns by the transfer control unit 7, and the signal charges are transferred. The transfer pulse φVHLD-R to be applied to the transfer preventing electrode 9 in Column R is changed to the middle level to transfer the signal charges held in the first vertical transfer unit 2 under the signal charge storage electrode 8 in Column R to the first vertical transfer unit 2 under the transfer preventing electrode 9.

Subsequently, in the period from times t9 to t10, φVHLD-R to be applied to the transfer preventing electrode 9, φVL2 to be applied to the transfer electrode 13 in the second vertical transfer unit 10, and φVL1 to be applied to the final vertical transfer electrode 14 in Column R are changed. Additionally, φH1a to be applied to the first horizontal transfer electrode 15A and φH1b to be applied to the first horizontal transfer electrode 15B are controlled to be the high level. Thereby, the signal charges in Column R are transferred to the first horizontal transfer unit 3. At this time, the transfer pulse φHHT to be applied to the branch transfer electrode 22 in the intermediate transfer unit 21 is kept at the low level to prevent mixing of the signal charges in the first horizontal transfer unit 3 with the signal charges in the second horizontal transfer unit 4.

Figure 4E:
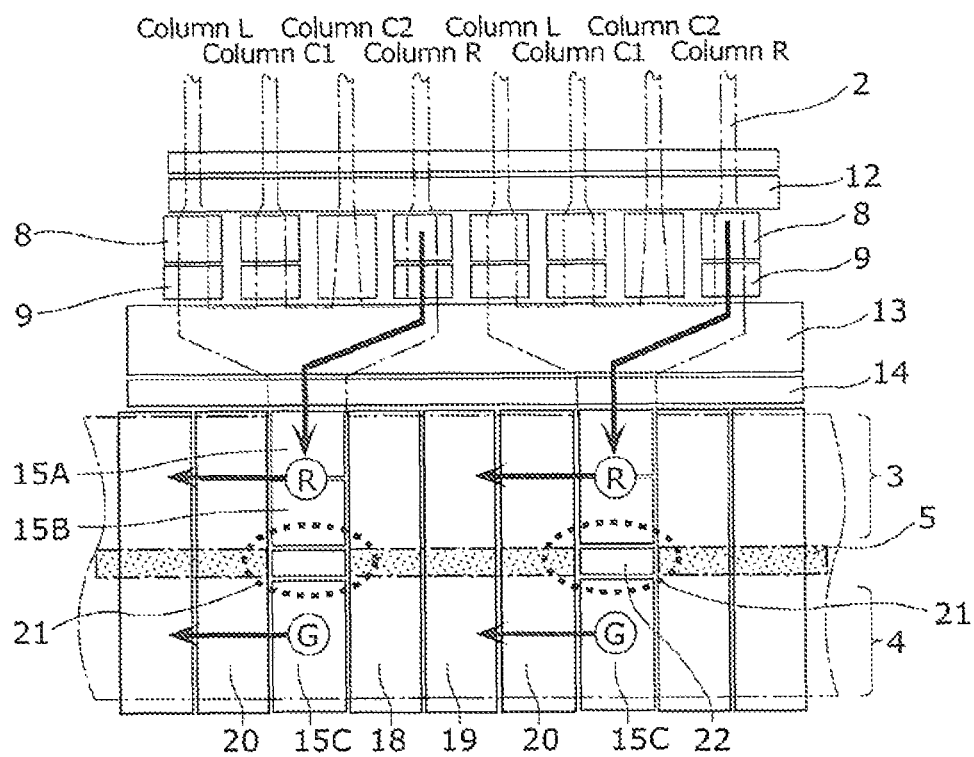
FIG. 4E is a diagram showing transfer of signal charges in the normal mode in the first embodiment of the present invention.

Subsequently, in the period from times t10 to t11, the signal charges in the first horizontal transfer unit 3 and those in the second horizontal transfer unit 4 are transferred to the first signal charge output unit 116 and the second signal charge output unit 117, respectively. Thereby, the signal charges in Column L and signal charges in Column R are output (FIG. 4E).

By the operation above, the signal charges in one line can be branched and output to the first horizontal transfer unit and the second horizontal transfer unit 4 at a high speed. Other signal charges can be sequentially output by the same transfer operation.

Figure 5:
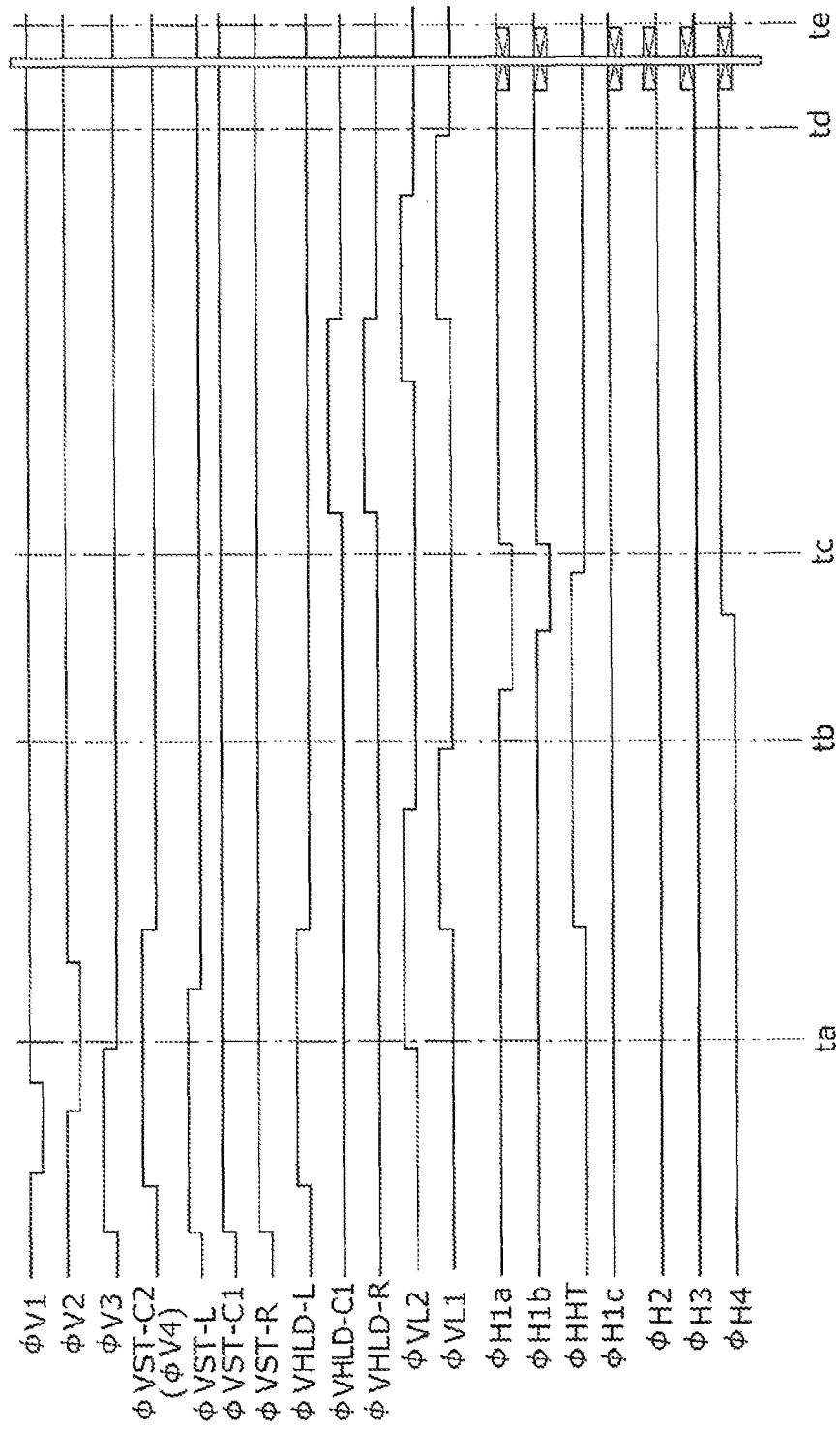
FIG. 5 is a timing chart showing a driving timing in a moving picture mode (in horizontal two-pixel addition) in the first embodiment of the present invention.
Figure 6A:
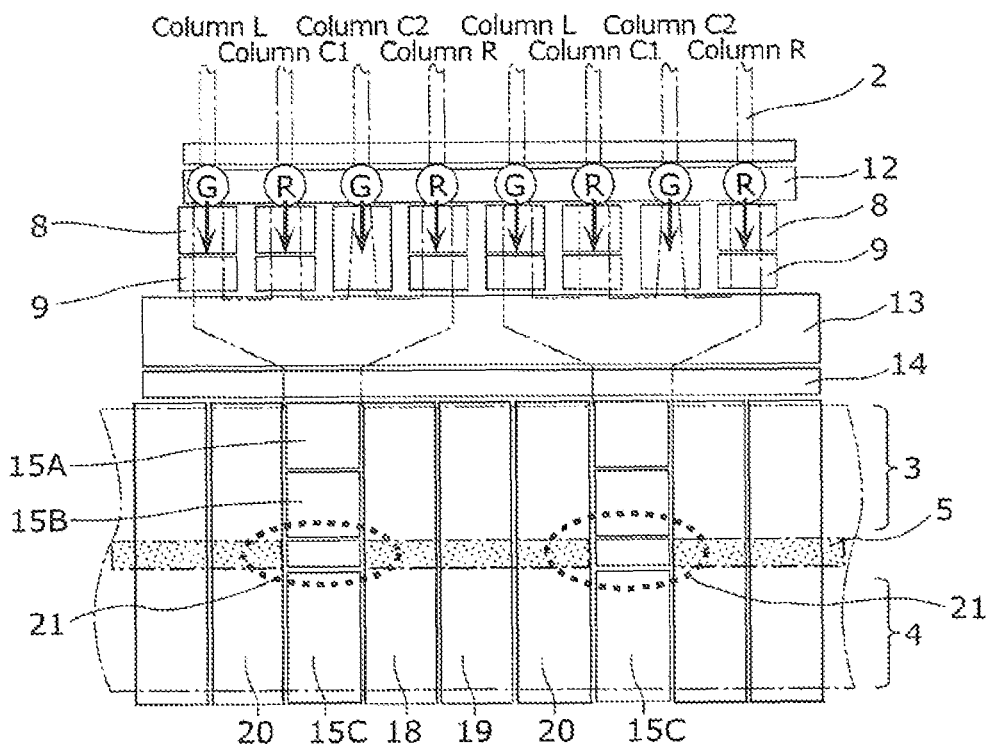
FIG. 6A is a diagram showing transfer of signal charges in the moving picture mode (in horizontal two-pixel addition) in the first embodiment of the present invention.
Figure 6B:
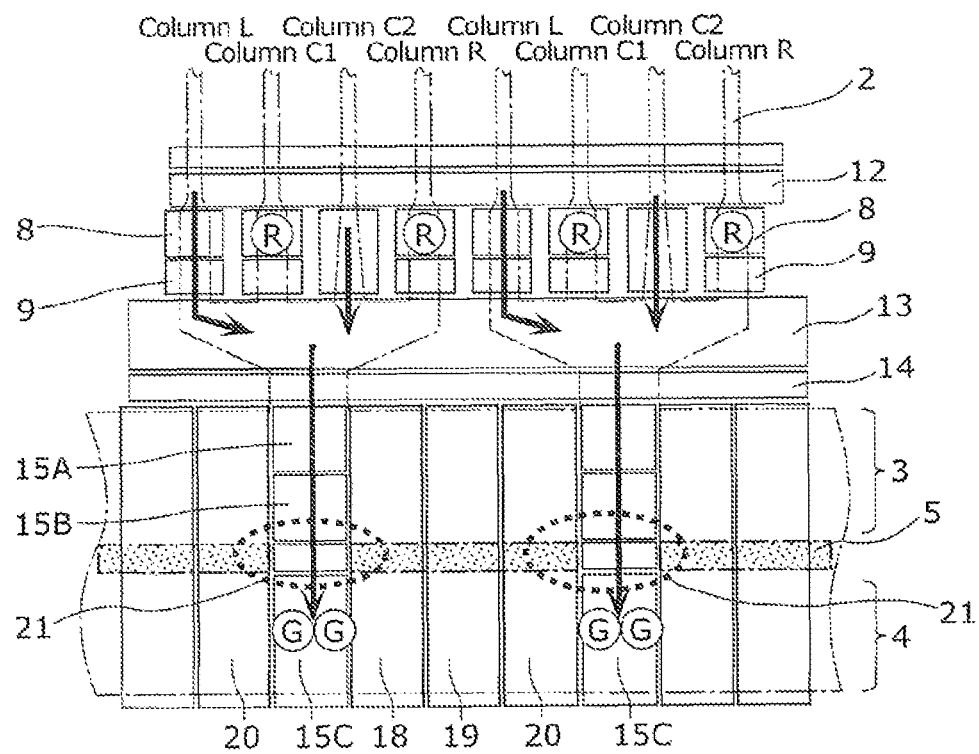
FIG. 6B is a diagram showing transfer of signal charges in the moving picture mode (in horizontal two-pixel addition) in the first embodiment of the present invention.
Figure 6C:
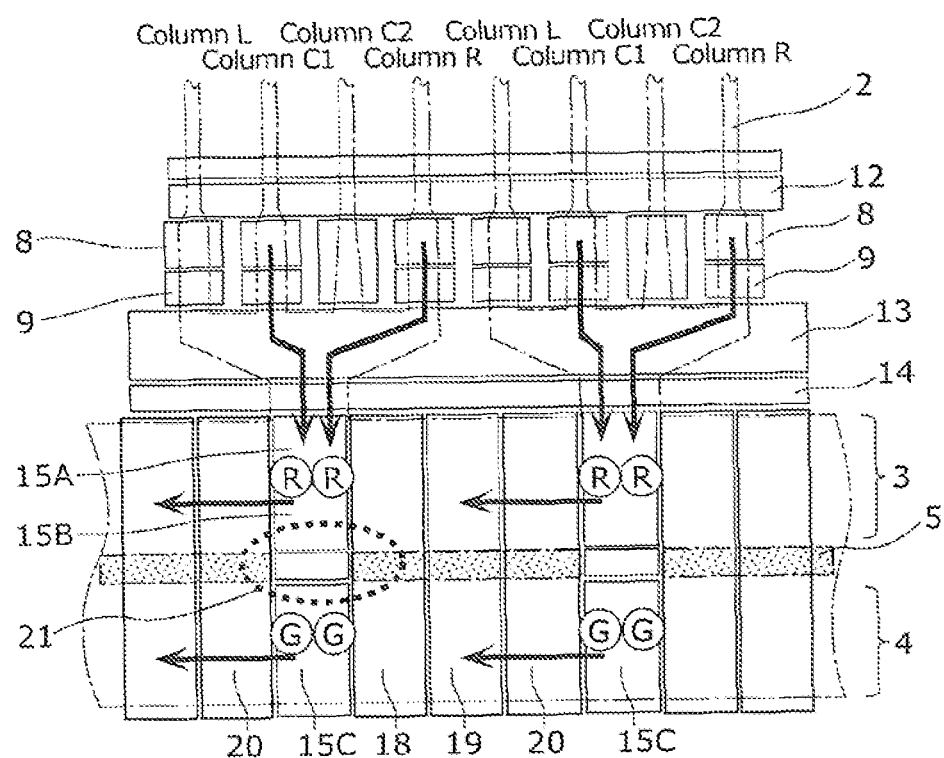
FIG. 6C is a diagram showing transfer of signal charges in a moving picture mode (in horizontal two-pixel addition) in the first embodiment of the present invention.

Next, the driving timing in a moving picture mode will be shown in FIG. 5, and diagrams showing transfer of signal charges will be shown in FIG. 6A to FIG. 6C. In the present embodiment, a case where signal charges of the same color adjacent in the horizontal direction are subjected to two-pixel addition is shown as an example.

First, as shown at a time ta in FIG. 5, the transfer pulse φV3 is applied to the intermediate electrode 12, and the transfer pulses φVST-L, φVST-C1, φVST-C2, and φVST-R are applied to the corresponding signal charge storage electrodes 8 in the same manner as that in the normal mode. Thereby, the signal charges stored in the first vertical transfer unit 2 under the intermediate electrode 12 in each of the columns are transferred to the first vertical transfer unit 2 under the signal charge storage electrode 8 in the corresponding column (FIG. 6A). Moreover, the transfer pulse φVHLD-C1 at the low level is applied to the transfer preventing electrode 9 in Column C1 and the transfer pulse φVHLD-R at the low level is applied to the transfer preventing electrode 9 in Column R to form a potential barrier. This prevents transfer of the signal charges to the next stage.

Next, in the period from times ta to tb, Column C2 and Column L are selected from the four columns by the transfer control unit 7, and the signal charges are transferred. In Column C1 and Column R not selected, the transfer pulses φVHLD-C1 and φVHLD-R to be applied to the corresponding transfer preventing electrodes 9 are kept at the low level, and the signal charges are held in the first vertical transfer unit 2 under the signal charge storage electrode 8 in the corresponding column. Additionally, the transfer pulse φVHLD-L in the transfer preventing electrode 9 in Column L, the transfer pulse φVST-C2 in the signal charge storage electrode 8 in Column C2, the transfer pulse φVL2 in the transfer electrode 13 in the second vertical transfer unit 10, and the transfer pulse φVL1 in the final vertical transfer electrode 14 are changed.

Concurrently, φH1a to be applied to the first horizontal transfer electrode 15A, φH1b to be applied to the first horizontal transfer electrode 15B, and φH1c to be applied to the first horizontal transfer electrode 15C are controlled to be the high level (for example, 1.8 V), and the transfer pulse φHHT at the high level is applied to the branch transfer electrode 22 in the intermediate transfer unit 21. Thereby, the signal charges in Column L and the signal charges in Column C2 are transferred to the first horizontal transfer unit 3 and the second horizontal transfer unit 4 (FIG. 6B). At this time, the transfer pulses φH2 to be applied to the second horizontal transfer electrode 18, φH3 to be applied to the third horizontal transfer electrode 19, and H4 to be applied to the fourth horizontal transfer electrode 20 are kept at the low level. Thereby, the signal charges in Column L and Column C2 corresponding to two pixels can be added.

Subsequently, in the period from times tb to tc, the transfer pulse φH1a to be applied to the first horizontal transfer electrode 15A, the transfer pulse φH1b to be applied to the first horizontal transfer electrode 15B, and the transfer pulse φHHT to be applied to the intermediate transfer unit 21 are changed to complete transfer of the signal charges from the first horizontal transfer unit 3 to the second horizontal transfer unit 4.

Next, in the period from times tc to td, Column C1 and Column R are selected from the four columns by the transfer control unit 7, and the signal charges are transferred. The transfer pulse φVHLD-C1 to be applied to the transfer preventing electrode 9 in Column C1, and the transfer pulse φVHLD-R to be applied to the transfer preventing electrode 9 in Column R are changed to the middle level, and the signal charges held in the first vertical transfer units 2 under the signal charge storage electrodes 8 in Column C1 and Column R are transferred to the first vertical transfer unit 2 under the transfer preventing electrode 9. Subsequently, φVHLD-C1 to be applied to the transfer preventing electrode 9 in Column C1, φVHLD-R to be applied to the transfer preventing electrode 9 in Column R, φVL2 to be applied to the transfer electrode 13 in the second vertical transfer unit 10, and φVL1 to be applied to the final vertical transfer electrode 14 are changed, and φH1a to be applied to the first horizontal transfer electrode 15A and φH1b to be applied to the first horizontal transfer electrode 15B are controlled to be the high level. Thereby, the signal charges in Column C1 and Column R are transferred to the first horizontal transfer unit 3. At this time, the transfer pulse φHHT to be applied to the branch transfer electrode 22 in the intermediate transfer unit 21 is kept at the low level to prevent mixing of the signal charges in the first horizontal transfer unit 3 with the signal charges in second horizontal transfer unit 4.

Subsequently, in the period from times td to te, the signal charges in the first horizontal transfer unit 3 and those in the second horizontal transfer unit 4 are transferred to the first signal charge output unit 116 and the second signal charge output unit 117, respectively. Thereby, the signal charges in Column C2 and Column L corresponding to two pixels and the signal charges in Column C1 and Column R corresponding to two pixels are output (FIG. 6C).

In the first vertical transfer unit 2, a plurality of read units 103 is provided, and the drive method is devised to perform the two-pixel addition in first vertical transfer unit 2. Accordingly, it is easy to realize the operation of four-pixel addition in combination with the horizontal two-pixel addition above.

Next, the reason that the configuration in the present embodiment can improve the problem in the related art, i.e., transfer degradation from the first horizontal transfer unit 3 to the second horizontal transfer unit 4 produced in the case of a solid-state imaging device formed of a cell having a small pixel size will be described with reference to the drawings.

Figure 7A:
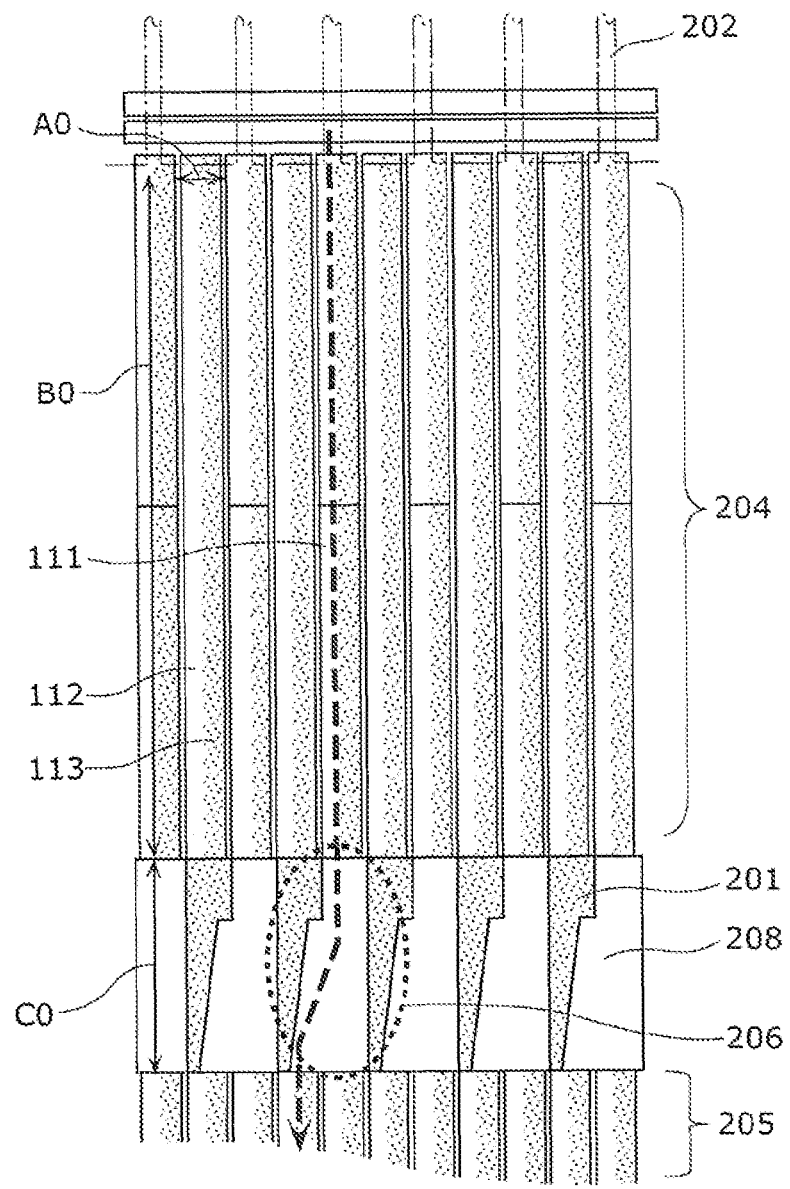
FIG. 7A is a partial plan view of a solid-state imaging device in the related art.
Figure 7B:
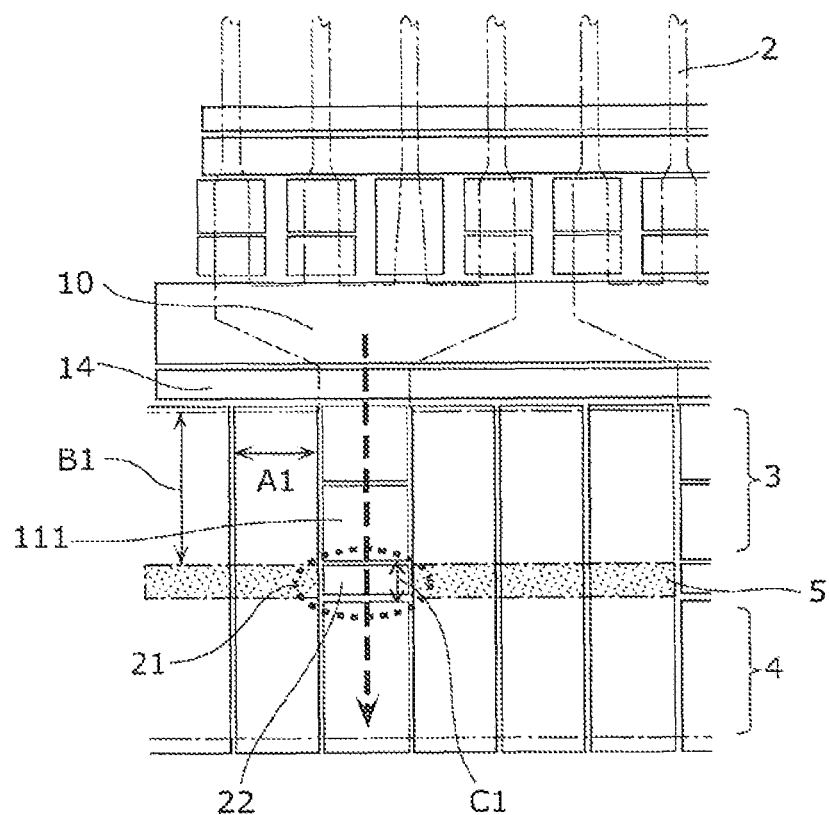
FIG. 7B is a partial plan view of the solid-state imaging device according to the first embodiment of the present invention.

FIG. 7A is a partial plan view of the solid-state imaging device in the related art, and FIG. 7B is a partial plan view of the solid-state imaging device 100 according to the present embodiment. In FIG. 7A and FIG. 7B, same components as those in FIG. 2A and FIG. 19 will be designated by same reference numerals, and the description thereof will be omitted. FIG. 7A and FIG. 7B both show a case where the solid-state imaging device is a single layer electrode. In FIGS. 7A and 7B, A0 and A1 represent a horizontal length of the horizontal transfer electrode, B0 and B1 represent a vertical length of the first horizontal transfer unit, and C0 and C1 represent a vertical length of the intermediate transfer unit.

As a feature of the configuration of the solid-state imaging device in the related art in FIG. 7A, the solid-state imaging device has the configuration in which for one column of the vertical transfer unit 202, each of the first horizontal transfer unit 204 and the second horizontal transfer unit 205 is formed of the two horizontal storage electrodes 209 and 211, and the first horizontal transfer unit 204 and the second horizontal transfer unit 205 are two-phase driven. In the case of the single layer electrode, as shown in FIG. 7A, a storage region 112 and a barrier region 113 are formed under the same electrode. The signal charges are transferred, as shown by a charge transfer path 111 in the drawing, from the vertical transfer unit 202, the storage region 112 in the first horizontal transfer unit 204, and the intermediate transfer unit 206 to the second horizontal transfer unit 205. Accordingly, in the case of the cell having a small pixel size, the horizontal length A0 of the horizontal storage electrode 209 is shorter, resulting in a smaller storage region 112. For this reason, in order to ensure a predetermined saturated charge amount, the vertical length B0 of the first horizontal transfer unit 204 needs to be greatly increased.

For example, when the pixel size is approximately 1.5 μm, the horizontal length A0 of the horizontal electrode needs to be approximately 0.7 μm (a half of the pixel size), and the horizontal length B0 of the first horizontal transfer unit 204 needs to be approximately 40 to 50 μm. Moreover, the configuration of the solid-state imaging device in the related art needs a state where the signal charges are stored only in the intermediate transfer unit 206, as shown in (b) and (c) in FIG. 20. Accordingly, the vertical length C0 of the intermediate transfer unit 206 also needs to be increased.

Meanwhile, as shown in FIG. 7B, the solid-state imaging device 100 according to the present embodiment has the configuration in which the four columns of the first vertical transfer unit 2 are collected in the second vertical transfer unit 10, and the second vertical transfer unit 10 is connected one of the horizontal transfer electrodes provided in the first horizontal transfer unit 3 (for example, the first horizontal transfer electrode 15A). The first horizontal transfer unit 3 and the second horizontal transfer unit 4 are four-phase driven, and one transfer packet is formed by the four columns of the horizontal transfer electrode. In the configuration, as described above, one transfer packet is formed for the four first vertical transfer units 2, and in the normal mode, transfer of the signal charges from the first vertical transfer unit 2 to the first horizontal transfer unit 3 and the second horizontal transfer unit 4, and the transfer operation of the signal charges from the first horizontal transfer unit 3 to the first signal charge output unit 116 and from the second horizontal transfer unit 4 to the second signal charge output unit 117 are divided into four and performed. Thereby, the signal charges in one line are divided into two and output by interlaced output. Thus, the horizontal length A1 of the horizontal electrode can be increased by the horizontal interlace.

Moreover, because the first horizontal transfer unit 3 and the second horizontal transfer unit 4 are four-phase driven, the barrier region 113 does not need to be formed under one horizontal transfer electrode, unlike two-phase drive in the solid-state imaging device in the related art shown in FIG. 7A. The entire region under one horizontal transfer electrode can store the signal charges. In the two-phase drive in the solid-state imaging device in the related art, approximately ½ of a gate voltage amplitude is used for displacement of the potential of the barrier region that does not contribute to storage of the charges, and the stored charge amount is determined by the condition for forming the barrier region. In contrast, in the three or more phase drive in which the barrier region does not need to be formed, displacement of the potential of the gate voltage amplitude contributes to the storage of the charges as it is. For this reason, in the three-phase drive and four-phase drive, the saturated charge amount per unit gate area can be approximately doubled or more than doubled. Accordingly, the vertical length B1 of the first horizontal transfer unit 3 for ensuring the saturated charge amount can be reduced. For the same reason, the three or more phase drive enables driving at a voltage lower than in the related art.

The configuration in the present embodiment uses the horizontal interlace, and a larger gate area in the horizontal direction can be ensured than in the related art. Accordingly, the vertical length B1 of the first horizontal transfer unit 3 for ensuring the saturated charge amount can be further reduced. For example, in the case of the four-phase drive, horizontal 4:1 interlace, and the pixel size of approximately 1.5 μm, A1 can be 1.5 μm (the same as the cell size), and the width B1 of the first horizontal transfer unit 3 can be approximately 6 to 10 μm.

Moreover, storage of the signal charges only in the intermediate transfer unit 21 is eliminated. Accordingly, the vertical length C1 of the intermediate transfer unit 21 can also be reduced. The intermediate transfer unit 21 may have only a region to be connected to a wire, and the vertical length C1 of the intermediate transfer unit 21 can be approximately 1 μm.

In FIG. 7A, the transfer path in transfer of the signal charges from the signal charges vertical transfer unit 202 via the first horizontal transfer unit 204 and the intermediate transfer unit 206 to the second horizontal transfer unit 205 is shown by a dotted line. Similarly, in FIG. 7B, the transfer path of the signal charges in transfer of the signal charges from the first vertical transfer unit 2 via the first horizontal transfer unit 3 and the intermediate transfer unit 21 to the second horizontal transfer unit 4 is shown by a dotted line. In the configuration of the solid-state imaging device 100 according to the present embodiment in FIG. 7B, the transfer path of the signal charges can be significantly shortened compared to the transfer path in the configuration of the solid-state imaging device in the related art in FIG. 7A. The significantly shortened transfer path can improve the transfer degradation from the first horizontal transfer unit and the second horizontal transfer unit, which is the problem in the related art. Moreover, the solid-state imaging device in the related art is configured to be driven by the horizontal two-phase drive system, and needs a relatively high voltage (for example, 3.3 to 5.0 V) in order to attain horizontal transfer. In the configuration of the solid-state imaging device 100 according to the present embodiment, by the horizontal four-phase drive system, vertical transfer of the signal charges between the first horizontal transfer unit 3 and the second horizontal transfer unit 4 and horizontal transfer can be attained by driving at a low voltage (for example, 1.8 V), providing the solid-state imaging device 100 with low electricity consumption. The drive system is not limited to the four-phase, and the number of the drive phase may be changed to the three-phase or five-phase.

Figure 8:
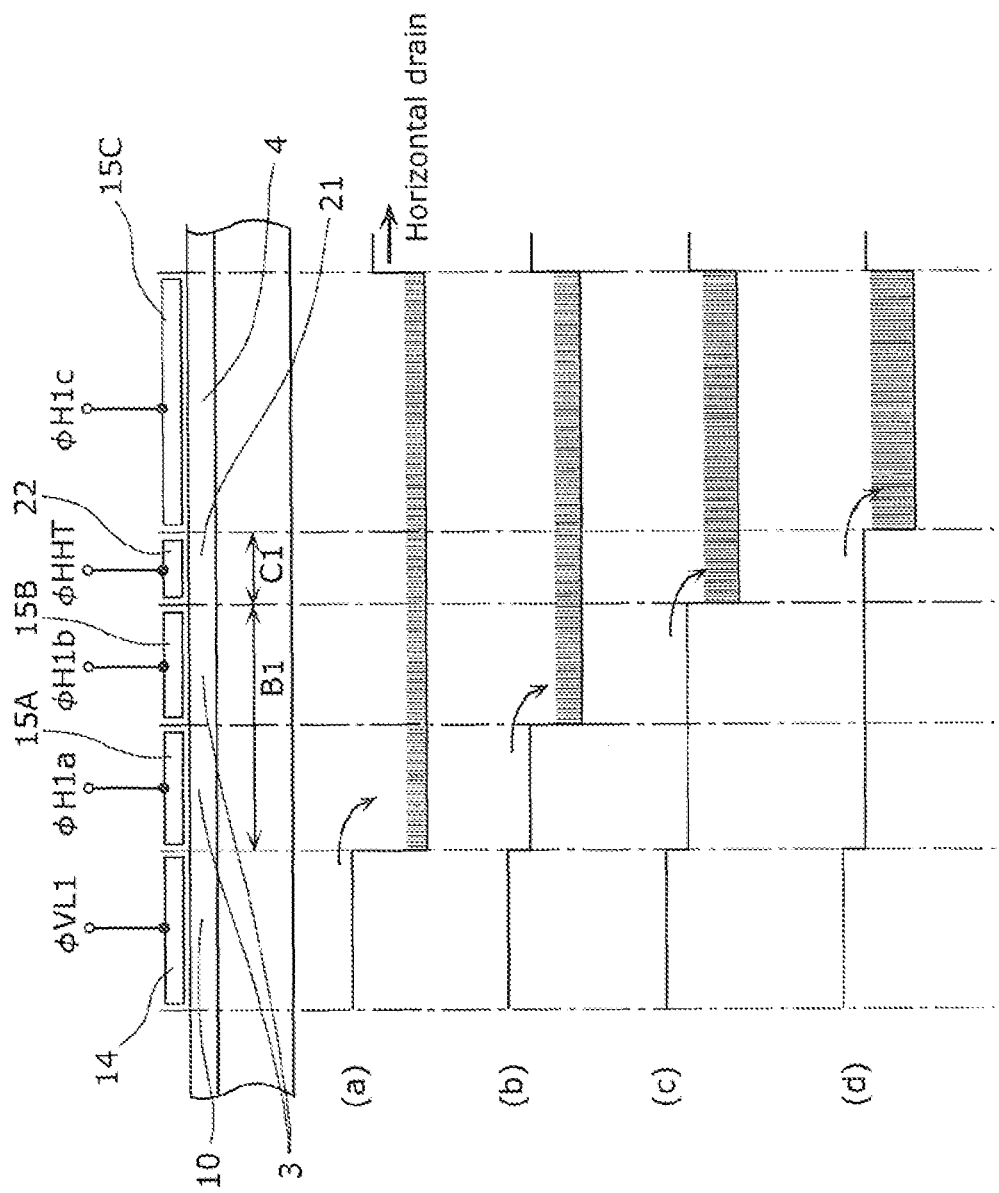
FIG. 8 is a schematic view of potential in the solid-state imaging device according to the first embodiment of the present invention.

FIG. 8 is a schematic view of the potential in transfer of the signal charges from the second vertical transfer unit 10 to the first horizontal transfer unit 3 and in transfer thereof from the first horizontal transfer unit 3 via the intermediate transfer unit 21 to the second horizontal transfer unit 4 in the configuration of the present embodiment. The schematic view of the potential in (a) to (d) of FIG. 8 corresponds to the period from times t1 to t2 in the driving timing chart in FIG. 3A and FIG. 3B.

First, as shown in FIG. 8(a), the transfer pulse φVL1 to be applied to the final vertical transfer electrode 14 is controlled to be the low level. The transfer pulse φH1a to be applied to the first horizontal transfer electrode 15A, the transfer pulse φH1b to be applied to the first horizontal transfer electrode 15B, the transfer pulse φH1c to be applied to the first horizontal transfer electrode 15C, and the transfer pulse φHHT to be applied to the branch transfer electrode 22 in the intermediate transfer unit 21 are controlled to be the high level. Thereby, the signal charges stored in the first vertical transfer unit 2 under the final vertical transfer electrode 14 are transferred to the first horizontal transfer unit 3, the intermediate transfer unit 21, and the second horizontal transfer unit 4.

Next, the transfer pulse φH1b to be applied to the first horizontal transfer electrode 15B in the first horizontal transfer unit 3, the φH1c to be applied to the first horizontal transfer electrode 15C in the second horizontal transfer unit 4, and the transfer pulse φHHT to be applied to the branch transfer electrode 22 are kept at the high level, and the transfer pulse φH1a to be applied to the first horizontal transfer electrode 15A is changed to the low level. Thereby, transfer of the signal charges stored under the first horizontal transfer electrode 15A is completed (FIG. 8(b)).

Subsequently, the transfer pulse φH1c to be applied to the first horizontal transfer electrode 15C, and the transfer pulse φHHT to be applied to the branch transfer electrode 22 are kept at the high level, and the transfer pulse φH1b to be applied to the first horizontal transfer electrode 15B is changed to the low level. Thereby, transfer of the signal charges stored under the first horizontal transfer electrode 15B is completed (FIG. 8(c)).

Subsequently, the transfer pulse φH1c to be applied to the first horizontal transfer electrode 15C is kept at the high level, and the transfer pulse φHHT to be applied to the branch transfer electrode 22 is changed to the low level. Thereby, transfer of the signal charges stored under the branch transfer electrode 22 is completed (FIG. 8(d)).

As above, in transfer from the first horizontal transfer unit 3 to the second horizontal transfer unit 4, the signal charges can be completely transferred by drive at a low voltage while the transfer degradation of the signal charges is prevented.

As described above, the vertical length. B1 of the first horizontal transfer unit 3 can be shortened compared to the vertical length B0 in the configuration in the related art, and the first horizontal transfer unit 3 has a short transfer distance and a structure in which transfer degradation hardly occurs. Additionally, the signal charges are completely transferred even at a low voltage applied to the first horizontal transfer unit 3 (for example, 1.8 V). The signal charges stored under the first horizontal transfer unit 3 are transferred by the two independent first horizontal transfer electrodes 15A and 15B. Thus, the transfer electric field is improved.

Figure 20:
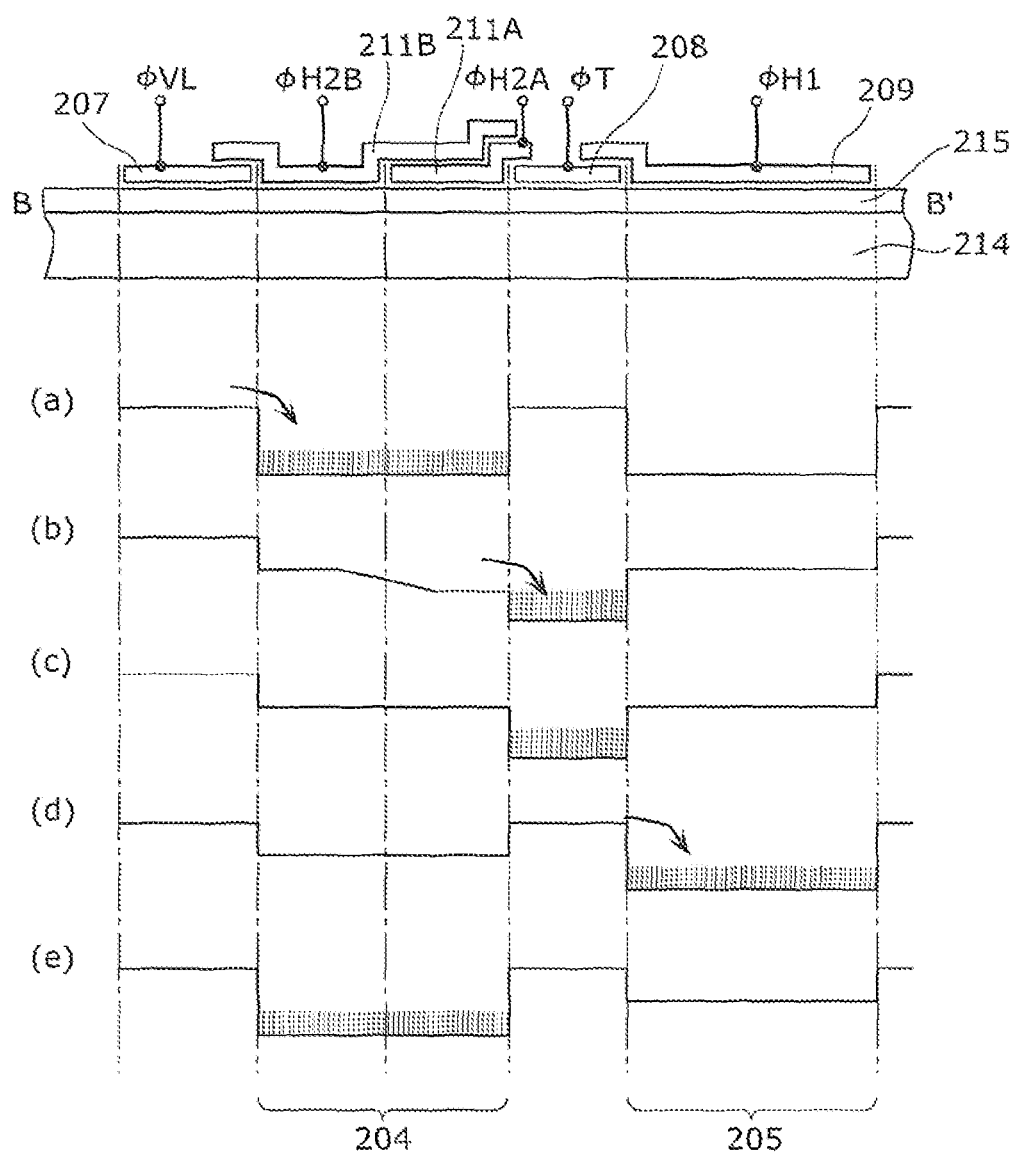
FIG. 20 is a schematic view of potential of the solid-state imaging device in the related art.
Figure 21:
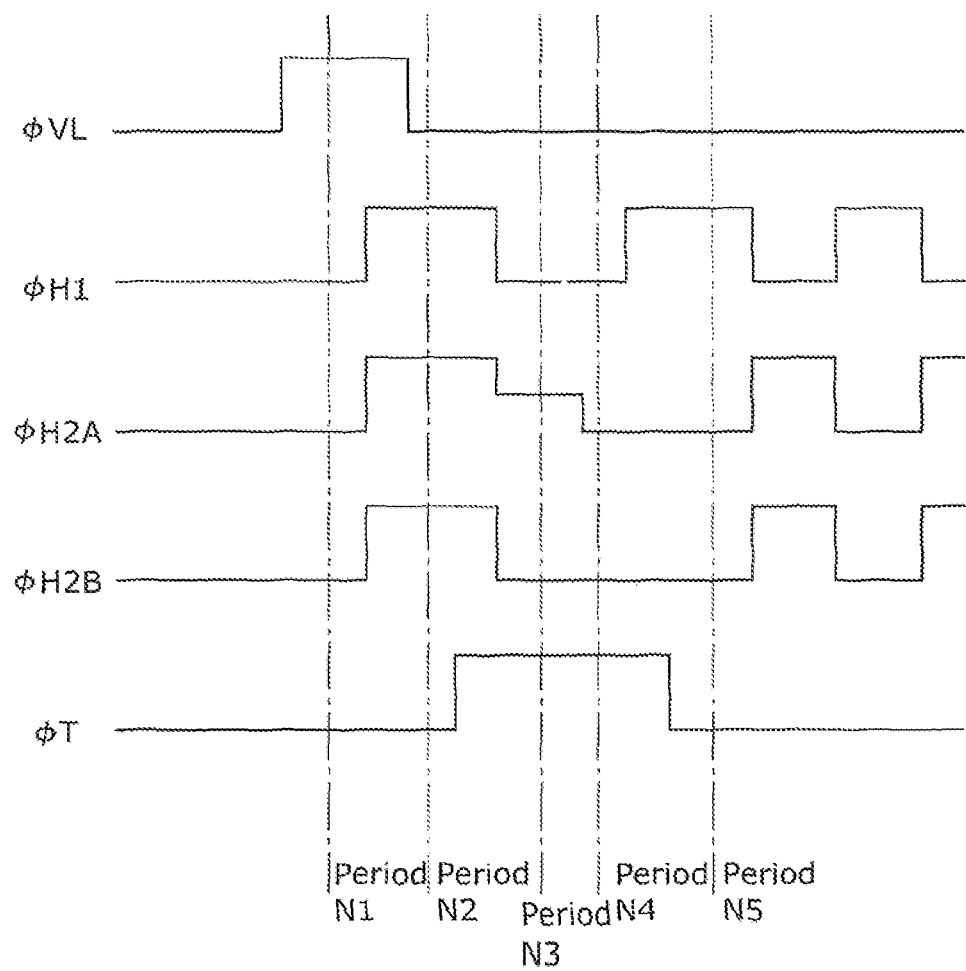
FIG. 21 is a timing chart showing a driving timing of the solid-state imaging device in the related art.
Figure 22A:
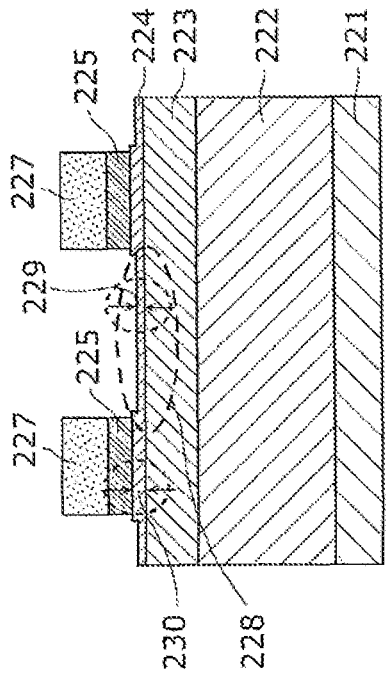
FIG. 22A is a schematic view showing steps of forming a transfer electrode in the solid-state imaging device in the related art.
Figure 22C:
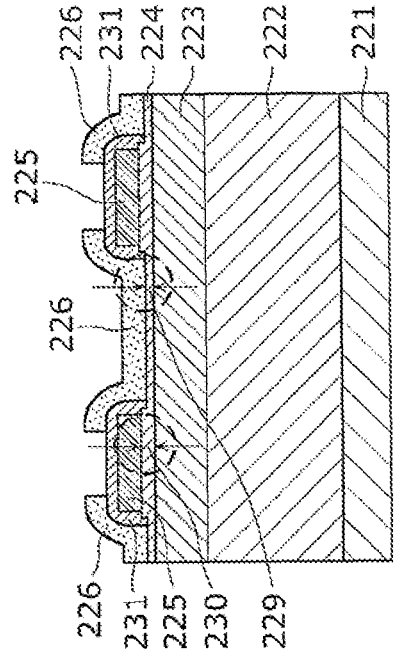
FIG. 22C is a schematic view showing steps of forming a transfer electrode in the solid-state imaging device in the related art.
Figure 22B:
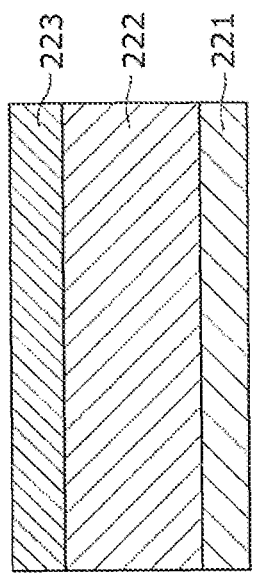
FIG. 22B is a schematic view showing steps of forming a transfer electrode in the solid-state imaging device in the related art.
Figure 22D:
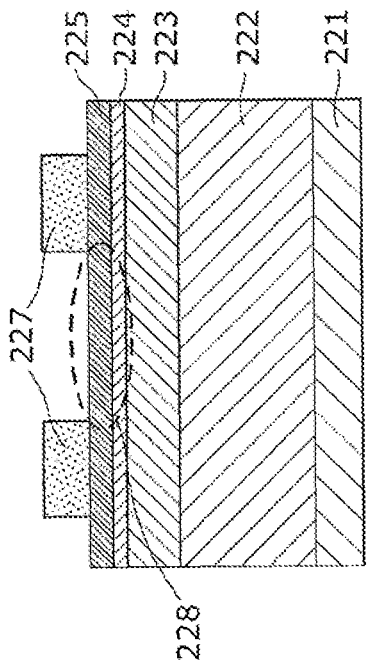
FIG. 22D is a schematic view showing steps of forming a transfer electrode in the solid-state imaging device in the related art.

In the configuration of the present embodiment, in the process to transfer the signal charges stored in the first vertical transfer unit 2 under the final vertical transfer electrode 14 to the second horizontal transfer unit 4, the signal charges are not temporarily stored only under the horizontal transfer electrode in the first horizontal transfer unit 3, or are not stored only under the branch transfer electrode 22 in the intermediate transfer unit 21, unlike the transfer process shown in the related art ((a) to (c) in FIG. 20). For this reason, the signal charges stored in the first vertical transfer unit 2 under the final vertical transfer electrode 14 can be transferred to the second horizontal transfer unit 4 under the first horizontal transfer electrode 15C efficiently. Particularly when the charge amount to be handled is relatively large and the charge density is high, at a point of time when the transfer pulse φVL1 to be applied to the final vertical transfer electrode 14 is changed to the low level, most of the signal charges stored in the first vertical transfer unit 2 under the final vertical transfer electrode 14 can be transferred by self-induced drift or thermal diffusion.

In the present embodiment, as shown in FIG. 2A, the second vertical transfer unit 10 is connected to one horizontal transfer electrode (for example, the first horizontal transfer electrode 15A). Thereby, transfer can be efficiently performed when the signal charges in the second vertical transfer unit 10 are transferred via the first horizontal transfer unit 3 and the intermediate transfer unit 21 to the second horizontal transfer unit 4.

For comparison, a configuration is shown in FIG. 9 in which the second vertical transfer unit 10 is connected to two horizontal transfer electrodes (for example, the first horizontal transfer electrode 15A and the second horizontal transfer electrode 18) (horizontal storage electrode is modified). The dotted line in FIG. 9 represents the transfer path of the signal charges. When the signal charges in the second vertical transfer unit 10 are received by the first horizontal transfer electrode 15A and the second horizontal transfer electrode 18, the second horizontal transfer electrode 18 needs to be changed to the low level in order to transfer the signal charges to the second horizontal transfer unit 4. For this reason, compared to the case when the second vertical transfer unit 10 is connected only to the first horizontal transfer electrode 15A, an extra transfer operation is needed, and the transfer path of the signal charges moved from the second vertical transfer unit 10 to the second horizontal transfer electrode 18 is increased. Accordingly, the configuration in the present embodiment eliminates such an unnecessary transfer operation, enabling efficient transfer.

When the signal charges are horizontally transferred in the first horizontal transfer unit 3 after transfer of the signal charges from the first horizontal transfer unit 3 to the second horizontal transfer unit 4 is completed, the transfer pulse φH1a to be applied to the first horizontal transfer electrode 15A is equalized to the transfer pulse φH1b to be applied to the first horizontal transfer electrode 15B. The horizontal transfer electrodes including the first horizontal transfer electrodes 15A and 15B are a single layer electrode, and the concentration of impurities in the horizontal transfer unit 3 under the first horizontal transfer electrode 15A is the same as that under the first horizontal transfer electrode 15B. Accordingly, when the transfer pulse φH1a is equal to φH1b, the first horizontal transfer unit 3 under the two electrodes have the same potential. Accordingly, the two first horizontal transfer electrodes 15A and 15B can function as one horizontal transfer electrode, and can be horizontally four-phase driven by applying φH1a to the first horizontal transfer electrode 15A and φH1b to the first horizontal transfer electrode 15B, and applying a different transfer pulse from φH1a and φH1b to the second, third, and fourth horizontal transfer electrodes 18, 19, and 20 as φH2, φH3, and φH4, respectively.

Moreover, in the configuration of the present embodiment, in order to strengthen the transfer electric field, no potential gradient is formed from the first horizontal transfer unit 3 toward the intermediate transfer unit 21 and the second horizontal transfer unit 4. One of the reasons is for the purpose of attaining the drive at a low voltage both in vertical transfer from the first horizontal transfer unit 3 to the second horizontal transfer unit 4 and horizontal transfer.

Figure 10:
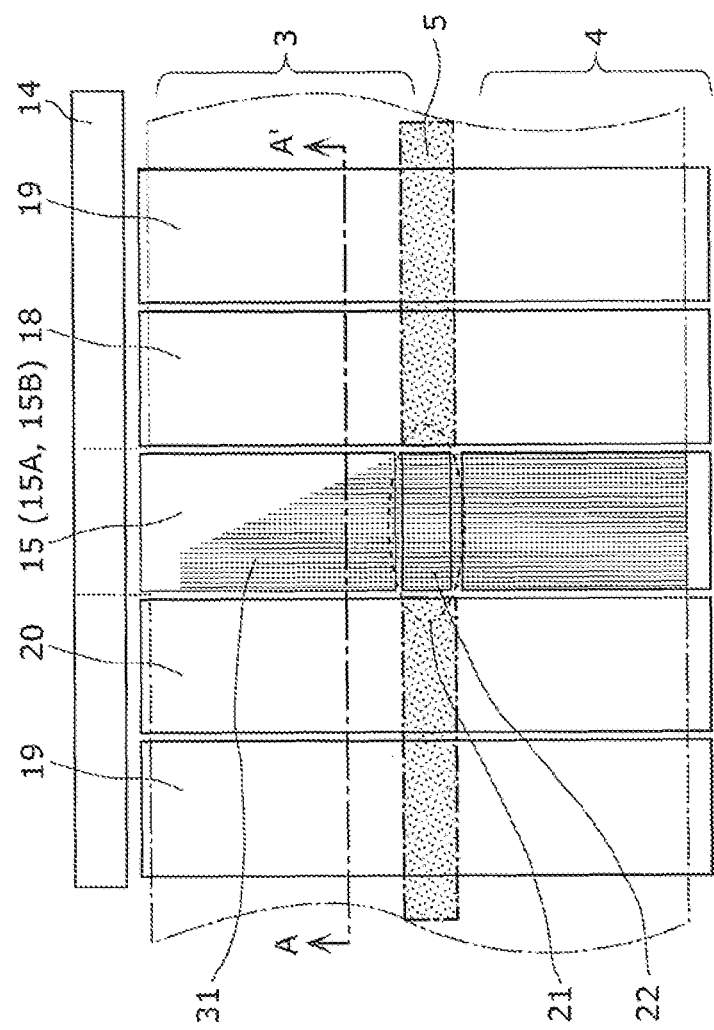
FIG. 10 is a partial configuration diagram of the solid-state imaging device according to the first embodiment of the present invention (n type impurities are additionally injected)
Figure 11:
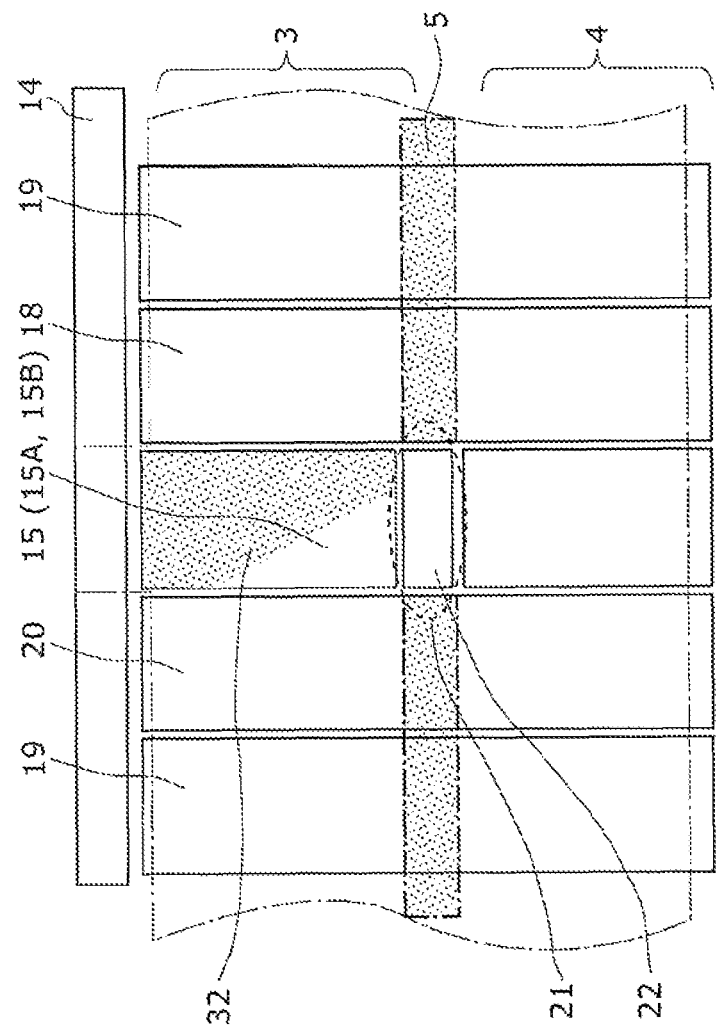
FIG. 11 is a partial configuration diagram of the solid-state imaging device according to the first embodiment of the present invention (p type impurities are additionally injected)

For comparison, a case where potential gradient is formed from the first horizontal transfer unit 3 toward the intermediate transfer unit 21 and the second horizontal transfer unit 4 in order to strengthen the transfer electric field is shown in FIG. 10 and FIG. 11. In FIG. 10, using the narrow channel effect, a potential gradient is formed by additionally injecting n type impurities by a standard method for providing a potential gradient such that an injection region is gradually increased along the direction of the intermediate transfer unit 21. In FIG. 10, an n type impurities injection region 31 is shown.

Figure 12:
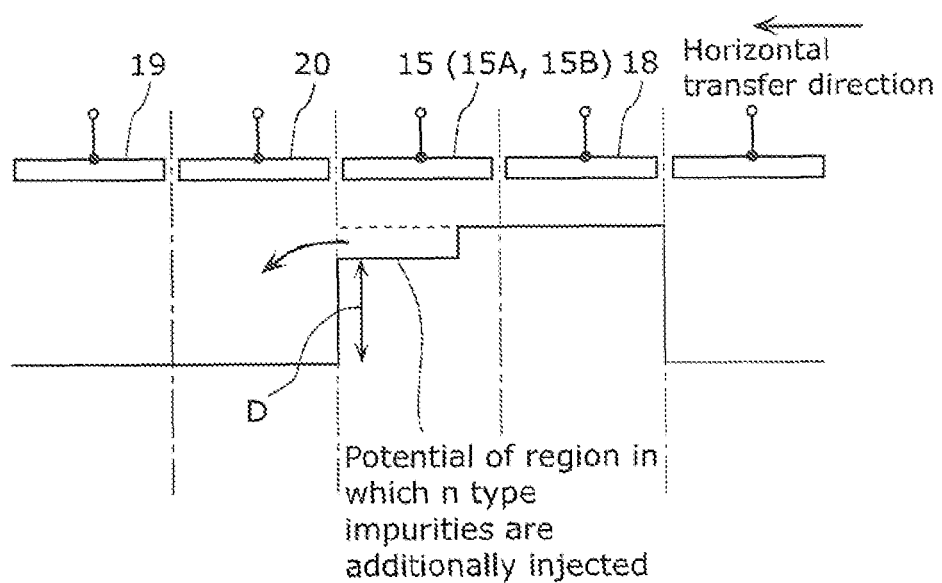
FIG. 12 is a schematic view of potential invention the solid-state imaging device according to the first embodiment of the present invention (n type impurities are additionally injected)

FIG. 12 is a schematic view of potential taken along the A-A' direction in FIG. 10, and shows a state in horizontal transfer. FIG. 12 shows a case where a transfer pulse at a low level is applied to the first horizontal transfer electrode 15 (first horizontal transfer electrodes 15A and 15B) and the second horizontal transfer electrode 18, a transfer pulse at a high level is applied to the third horizontal transfer electrode 19 and the fourth horizontal transfer electrode 20, and the signal charges stored under the first horizontal transfer unit 3 in the first horizontal transfer electrode 15 are transferred to the fourth horizontal transfer electrode 20 at the next stage.

As shown in FIG. 12, the potential is deeper in the injection region 31 in which n type impurities are additionally injected in the first horizontal transfer unit 3 under the first horizontal transfer electrode 15. As a result, a potential difference D between the first horizontal transfer electrode 15 and the first horizontal transfer unit 3 under the fourth horizontal transfer electrode 20 at the next stage is smaller. When the potential difference D is small, the transfer electric field is insufficient, and the signal charges remain in the first horizontal transfer unit 3 under the first horizontal transfer electrode 15, causing transfer degradation. When the horizontal driving voltage is increased, the potential difference D can be increased to improve the transfer electric field, and transfer can be performed while transfer degradation is suppressed. On the other hand, a high horizontal driving voltage leads to significant increase in electricity consumption.

Alternatively, in order to improve the transfer electric field from the first horizontal transfer unit 3 toward the intermediate transfer unit 21 and the second horizontal transfer unit 4, as shown in FIG. 11, potential gradient can also be formed by additionally injecting p type impurities such that the injection region is narrower on the side of the intermediate transfer unit 21. In FIG. 11, a p type impurities injection region 32 is shown.

In this case, in the first horizontal transfer unit 3, the difference between the potential of the first horizontal transfer unit 3 under the first horizontal transfer electrode 15 on the side of the intermediate transfer unit 21 and the potential of the first horizontal transfer unit 3 under the fourth horizontal transfer electrode 20 at the next stage is equal to the difference therebetween when no additional injection is performed, and the transfer electric field in horizontal transfer is not reduced. However, p type impurities are injected into most of the first horizontal transfer unit 3 under the first horizontal transfer electrode 15. Accordingly, the saturated charge amount of the signal charges that can be stored is significantly reduced in the first horizontal transfer unit 3 under the first horizontal transfer electrode 15.

Contrary to this, in the configuration of the present embodiment, the plurality of independent column direction electrodes is a single layer electrode provided in the vertical direction in the first horizontal transfer unit 3, and no potential gradient is formed in the first horizontal transfer unit 3. This prevents reduction in the saturated charge amount, and vertical transfer from the first horizontal transfer unit 3 to the second horizontal transfer unit 4 and horizontal transfer can be attained at a low horizontal driving voltage.

When the potential gradient is formed, the signal charges are horizontally transferred in a meandering manner in horizontal transfer. This increases the transfer path of the signal charges, and transfer degradation is likely to occur. The configuration of the present embodiment has no potential gradient, and the signal charges are not transferred in a meandering manner as above. In the configuration of the present embodiment, the concentration of impurities in the first horizontal transfer unit 3 is equal to that in second horizontal transfer unit 4. Accordingly, the potentials are substantially the same in the channels. Thereby, the difference in efficiency of horizontal transfer between the first horizontal transfer unit 3 and the second horizontal transfer unit 4 can be reduced.

The present embodiment shows an example in which the first horizontal transfer unit 3 and the second horizontal transfer unit 4 include four columns of horizontal transfer electrodes to which four-phases of the transfer pulse is applied, the four-phases of the transfer pulse forming one transfer packet for four columns of the first vertical transfer unit 2, and transfer of the signal charges is repeated in unit of four columns in the horizontal direction. Alternatively, the present invention can be used in a structure in which the first horizontal transfer unit 3 and the second horizontal transfer unit 4 can include horizontal transfer electrodes to which a transfer pulse is applied, the transfer pulse forming one transfer packet for two or three columns of the first vertical transfer unit 2, and the transfer control unit 7 is repeated in unit of two columns or three columns in the horizontal direction.

As above, according to the present embodiment, the transfer control unit 7 that selectively controls transfer of the signal charges from the first vertical transfer unit 2 to the first horizontal transfer unit 3 and the second horizontal transfer unit 4 is provided to provide a structure enabling horizontal interlace, and the first horizontal transfer unit 3 and the second horizontal transfer unit 4 are configured to be four-phase driven. Thereby, the width of the first horizontal transfer unit 3 disposed in parallel with the transfer control unit 7 can be significantly reduced.

Further, in the first horizontal transfer unit 3, the horizontal transfer electrode for transferring the signal charges to the second horizontal transfer unit 4 is composed of a plurality of independent column direction electrodes provided in the vertical direction, and different transfer pulses are applied to the respective electrodes. Thereby, transfer from the first horizontal transfer unit 3 to the second horizontal transfer unit 4 can be completely performed at a low voltage without transfer degradation.

Further, in the transfer control unit 7 on the side of the first horizontal transfer unit 3, one horizontal transfer electrode (for example, first horizontal transfer electrode 15A) in which the first vertical transfer units 2 are collected is formed to be included in the second vertical transfer unit 10. Moreover, the intermediate transfer unit 21 is formed in the vertical transfer direction of the one horizontal transfer electrode included in the second vertical transfer unit 10. Thereby, the transfer path can be shortened, and efficient transfer operation can be performed. Thereby, a solid-state imaging device enabling high speed drive and low electricity consumption can be attained.

In the present embodiment, the first horizontal transfer electrodes 15A and 15B are formed to have a horizontal length on the side of the second vertical transfer unit 10 equal to the horizontal length on the side of the intermediate transfer unit 21. Alternatively, the first horizontal transfer electrodes 15A and 15B may be formed to have a horizontal length on the side of the second vertical transfer unit 10 shorter than the horizontal length on the side of the intermediate transfer unit 21.

Embodiment 2

Next, a second embodiment according to the present invention will be described.

Figure 13:
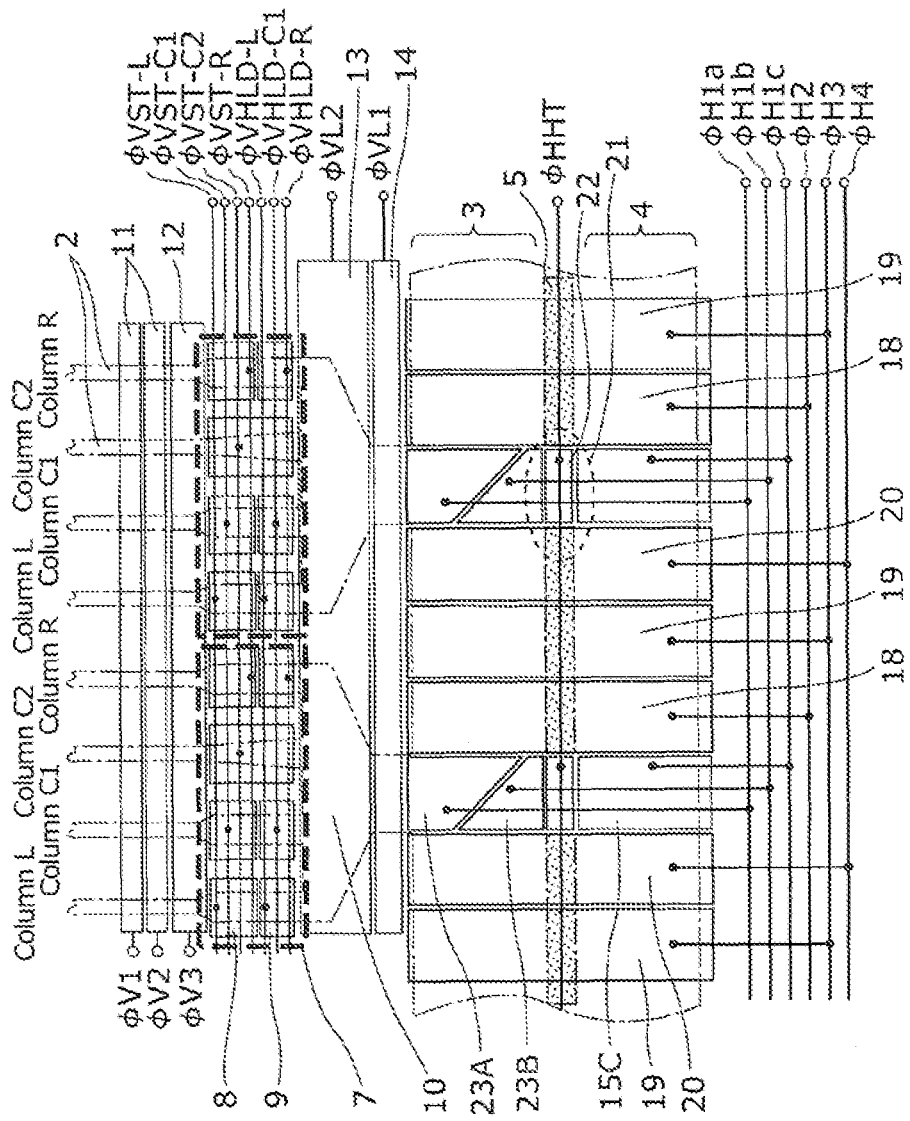
FIG. 13 is a partial configuration diagram of a solid-state imaging device according to a second embodiment of the present invention.

FIG. 13 is a partial configuration diagram of a solid-state imaging device according to the second embodiment of the present invention. In FIG. 13, same components are designated by same reference number as those in FIG. 2A.

The present embodiment is different from the first embodiment in that two independent column direction electrodes for transferring the signal charges from the first horizontal transfer unit 3 to the intermediate transfer unit 21 are formed to have a predetermined angle to the horizontal direction at an interface between the two electrodes. Namely, instead of the first horizontal transfer electrodes 15A and 15B in the first embodiment, as shown in FIG. 13, the first horizontal transfer electrodes 23A and 23B are formed such that the interface between the two first horizontal transfer electrodes 23A and 23B has a predetermined angle to the horizontal direction. Thereby, when the signal charges are transferred from the first horizontal transfer unit 3 to the intermediate transfer unit 21 and the second horizontal transfer unit 4, a potential gradient can be formed by the narrow channel effect such that the potential on the side of the intermediate transfer unit 21 is deep, further strengthening the transfer electric field.

Meanwhile, in horizontal transfer, the same transfer pulse is applied to the first horizontal transfer electrodes 23A and 23B. Accordingly, the two independent first horizontal transfer electrodes 23A and 23B function in the same manner as in the case of one electrode. Accordingly, the concentration of impurities in the first horizontal transfer unit 3 under the first horizontal transfer electrode 23A is the same as that under the first horizontal transfer electrode 233. For this reason, the two electrodes under the first horizontal transfer unit 3 to which the same transfer pulse is applied have the same potential, and no potential gradient is formed in horizontal transfer. As described in the first embodiment, this can prevent the problem caused in performing horizontal transfer in the state where a potential gradient is formed.

As above, according to the present embodiment, a transfer electric field stronger than that in the first embodiment can be provided in transfer from the first horizontal transfer unit 3 to the second horizontal transfer unit 4, attaining a solid-state imaging device enabling drive at a lower voltage.

The interface between the two first horizontal transfer electrodes 23A and 23B is formed to have a predetermined angle to the horizontal direction, and additionally, the first horizontal transfer electrode 23B may be formed to have a trapezoidal shape in which the width is wider toward the side of the intermediate transfer unit 21.

Embodiment 3

Next, a third embodiment according to the present invention will be described.

Figure 14:
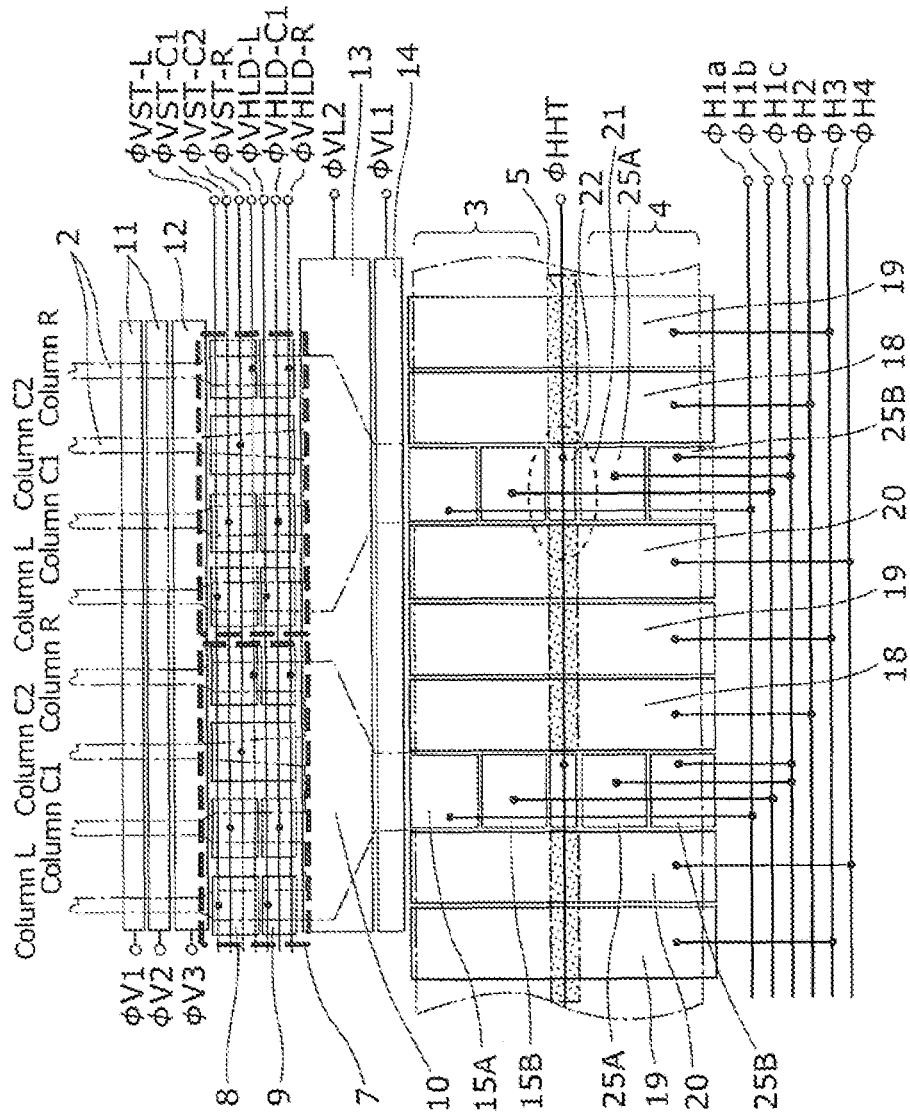
FIG. 14 is a partial configuration diagram of a solid-state imaging device according to a third embodiment of the present invention.

FIG. 14 is a partial configuration diagram of a solid-state imaging device according to the third embodiment of the present invention. In FIG. 14, same components are designated by same reference number as those in FIG. 2A.

The present embodiment is different from the first embodiment in that the electrode in the second horizontal transfer unit 4 that receives the signal charges from the intermediate transfer unit 21 is composed of two independent column direction electrodes similarly to the configuration of the column direction electrode in the first horizontal transfer unit 3. Namely, instead of the first horizontal transfer electrode 15C in the first embodiment, the second horizontal transfer unit 4 includes first horizontal transfer electrodes 25A and 25B as shown in FIG. 14.

In FIG. 14, two horizontal transfer electrodes of the first horizontal transfer electrodes 25A and 25B are independently formed while the same transfer pulse ϕH1c is always applied to the first horizontal transfer electrodes 25A and 25B. For this reason, the first horizontal transfer electrodes 25A and 25B function as one horizontal transfer electrode, and the transfer operation is the same as that in the first embodiment. In the present embodiment, the first horizontal transfer unit 3 and the second horizontal transfer unit 4 have the same configuration. Thereby, the difference in horizontal transfer efficiency between the first horizontal transfer unit 3 and the second horizontal transfer unit 4 can be further reduced.

As above, according to the present embodiment, a solid-state imaging device can be provided in which the difference in horizontal transfer efficiency between the first horizontal transfer unit 3 and the second horizontal transfer unit 4 can be further reduced compared to the first embodiment.

Embodiment 4

Next, a fourth embodiment according to the present invention will be described.

Figure 15:
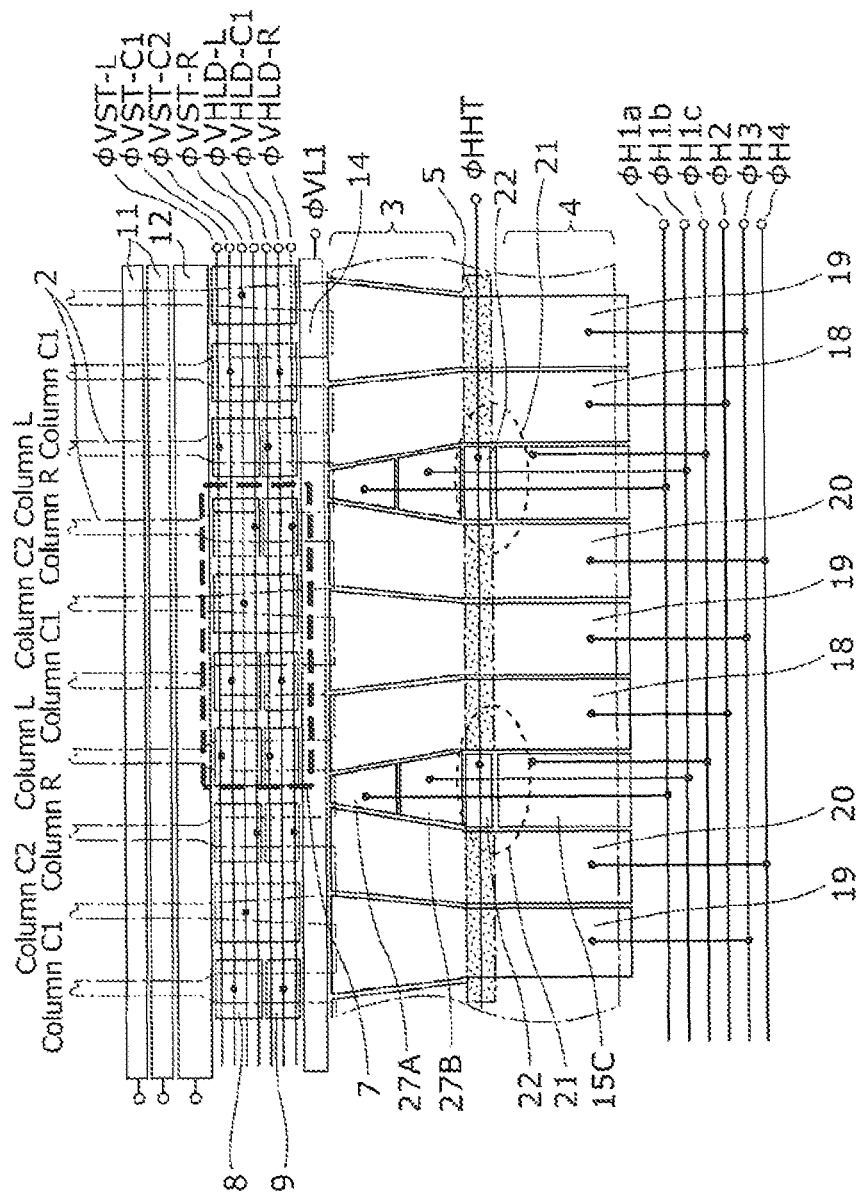
FIG. 15 is a partial configuration diagram of a solid-state imaging device according to a fourth embodiment of the present invention.

FIG. 15 is a partial configuration diagram of a solid-state imaging device according to the fourth embodiment of the present invention. In FIG. 15, same components are designated by same reference number as those in FIG. 2A.

The present embodiment is different from the first embodiment in that the first vertical transfer unit 2 is formed extending to the first horizontal transfer unit 3 without being collected. Namely, in the first embodiment, the solid-state imaging device 100 has the second vertical transfer unit 10 connected to four columns of the first vertical transfer unit 2. Contrary to this, the present embodiment has no second vertical transfer unit 10, and the four columns of the first vertical transfer unit 2 are not collected into one. Moreover, in the first embodiment, the second vertical transfer unit 10 is provided in a position corresponding to the first horizontal transfer electrode 15A in the first horizontal transfer unit 3. In the present embodiment, first horizontal transfer electrodes 27A and 273 are independently provided in a position not corresponding to any first vertical transfer unit 2. Further, in both of the first horizontal transfer electrodes 27A and 27B, the horizontal length on the side of the first vertical transfer unit 2 is shorter than the horizontal length on the side of the intermediate transfer unit 21. In other words, the first horizontal transfer electrodes 27A and 278 are formed to have a trapezoidal shape in which the width is wider toward the side of the intermediate transfer unit 21.

The horizontal length of the first horizontal transfer electrode 27 A on the side of the first vertical transfer unit 2 is shorter than that of the first horizontal transfer electrode 15A in the first embodiment. Thereby, when the signal charges are transferred from the first horizontal transfer unit 3 to the intermediate transfer unit 21 and the second horizontal transfer unit 4, the narrow channel effect can be enhanced, and a potential gradient can be formed such that the potential on the side of the intermediate transfer unit 21 is deep. As a result, the transfer electric field can be further strengthened.

Moreover, the first vertical transfer unit 2 is formed extending to the first horizontal transfer unit 3 without being collected. Accordingly, for four columns of the first vertical transfer unit 2, the transfer pulses applied to two or three of the first to fourth horizontal transfer electrodes (15A, 15B, 15C, 18, 19, and 20), for example, can be controlled to be a high level, and the two or three of the horizontal transfer electrodes can receive the signal charges simultaneously. Thereby, the potential under the final vertical transfer electrode 14 can be shallower than that in the first embodiment shown in FIG. 2A. In the first horizontal transfer unit 3, the potential under the horizontal electrode can be deeper than that in the first embodiment shown in FIG. 2A, the horizontal electrode receiving the signal charges from the first vertical transfer unit 2. Thereby, the transfer electric field from the first vertical transfer unit 2 to the first horizontal transfer unit 3 can be improved to suppress the transfer failure.

In the present embodiment, the first vertical transfer units 2 are not collected. Accordingly, unlike the first embodiment, the horizontal transfer electrode in the second vertical transfer unit 10 connected to the first vertical transfer units 2 can be eliminated, reducing the number of terminals in the package.

As above, according to the present embodiment, compared to the first embodiment, the transfer electric field can be more strengthened in transfer of the signal charges from the first vertical transfer unit 2 to the first horizontal transfer unit 3 and in transfer of the signal charges from the first horizontal transfer unit 3 to the second horizontal transfer unit 4 to suppress the transfer failure. Further, the number of terminals can be reduced.

In the present embodiment, the first horizontal transfer unit 3 has a shape of the gate different from that of the second horizontal transfer unit 4. Alternatively, similarly to the third embodiment, the second horizontal transfer unit 4 and the first horizontal transfer unit 3 can be formed to have a symmetric shape of the gate, reducing the difference in transfer efficiency between the second horizontal transfer unit 3 and the first horizontal transfer unit 4.

Embodiment 5

Next, a fifth embodiment according to the present invention will be described.

Figure 16:
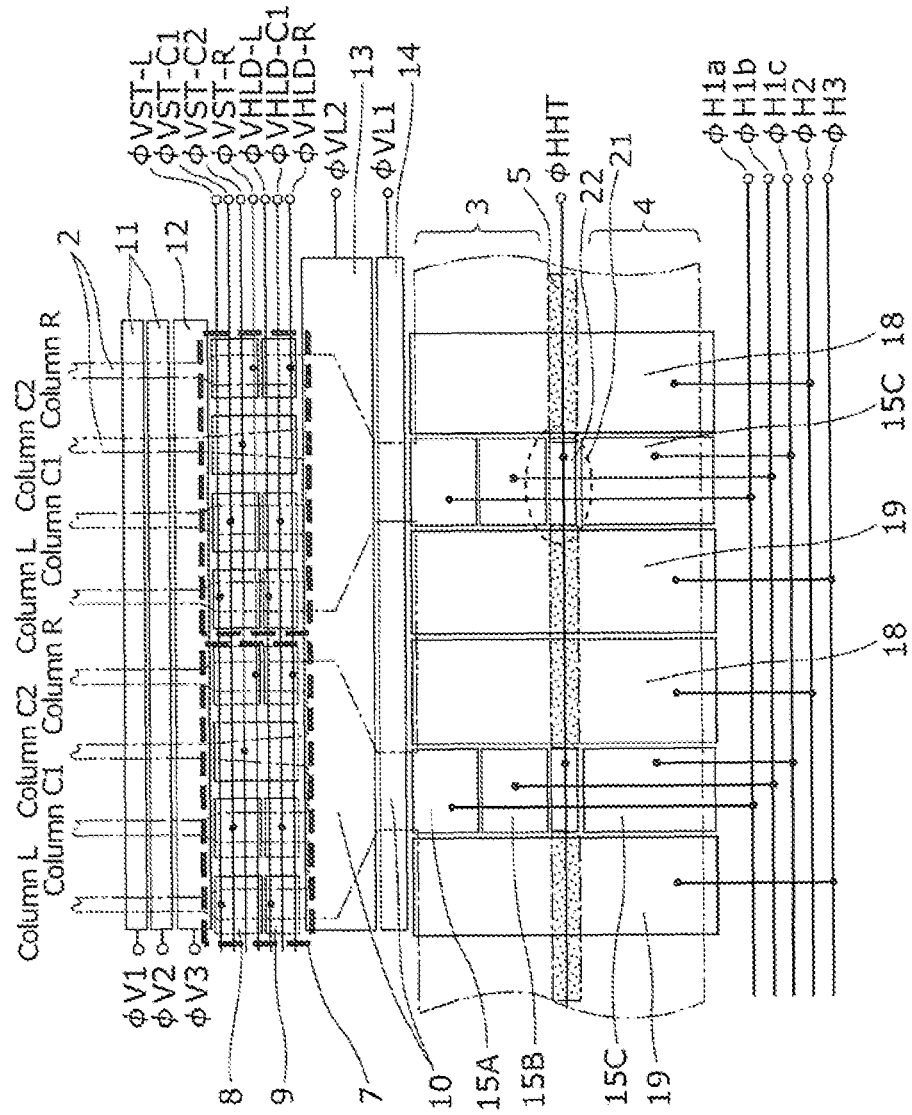
FIG. 16 is a partial configuration diagram of a solid-state imaging device according to a fifth embodiment of the present invention.

FIG. 16 is a partial configuration diagram of a solid-state imaging device according to the fifth embodiment of the present invention. In FIG. 16, same components are designated by same reference number as those in FIG. 2A.

The present embodiment is different from the first embodiment in that the horizontal transfer electrodes provided in the first horizontal transfer unit 3 are three horizontal transfer electrodes of one column of the first horizontal transfer electrodes 15A and 15B, the second horizontal transfer electrode 18, and the third horizontal transfer electrode 19, and the horizontal transfer electrodes provided in the second horizontal transfer unit 4 are three horizontal transfer electrodes of the first horizontal transfer electrode 15C, the second horizontal transfer electrode 18, and the third horizontal transfer electrode 19. Namely, one transfer packet is formed by the three horizontal transfer electrodes, and the horizontal transfer units 3 and 4 transfer the signal charges by horizontal three-phase drive. Similarities with the first embodiment are that one transfer packet is provided for the four columns of the vertical transfer unit 2, and that the electrode for transferring the signal charges from the first horizontal transfer unit 3 to the intermediate transfer unit 21 is composed of independent two electrodes. In the first embodiment, the horizontal transfer electrode is composed of four transfer electrodes for four columns of the vertical transfer unit. In the fifth embodiment, the horizontal transfer electrode is composed of three electrodes for four columns of the vertical transfer unit. For this reason, the electrode length of the horizontal transfer electrode in the horizontal direction is approximately 1.3 times longer than that of the horizontal transfer electrode in the first embodiment.

Thereby, the number of electrodes in the horizontal transfer unit can be reduced, reducing the number of terminals in the package. The inter-electrode capacitance can also be reduced, attaining low electricity consumption if the horizontal driving voltage is the same. A longer horizontal transfer electrode length reduces the transfer electric field in horizontal transfer, but a potential gradient can be formed by additional injection to improve the transfer electric field and suppress the transfer failure.

As above, according to the present embodiment, a solid-state imaging device can be provided in which the number of terminals can be reduced and lower electricity consumption is enabled compared to the first embodiment.

Embodiment 6

Next, a sixth embodiment according to the present invention will be described.

Figure 17A:
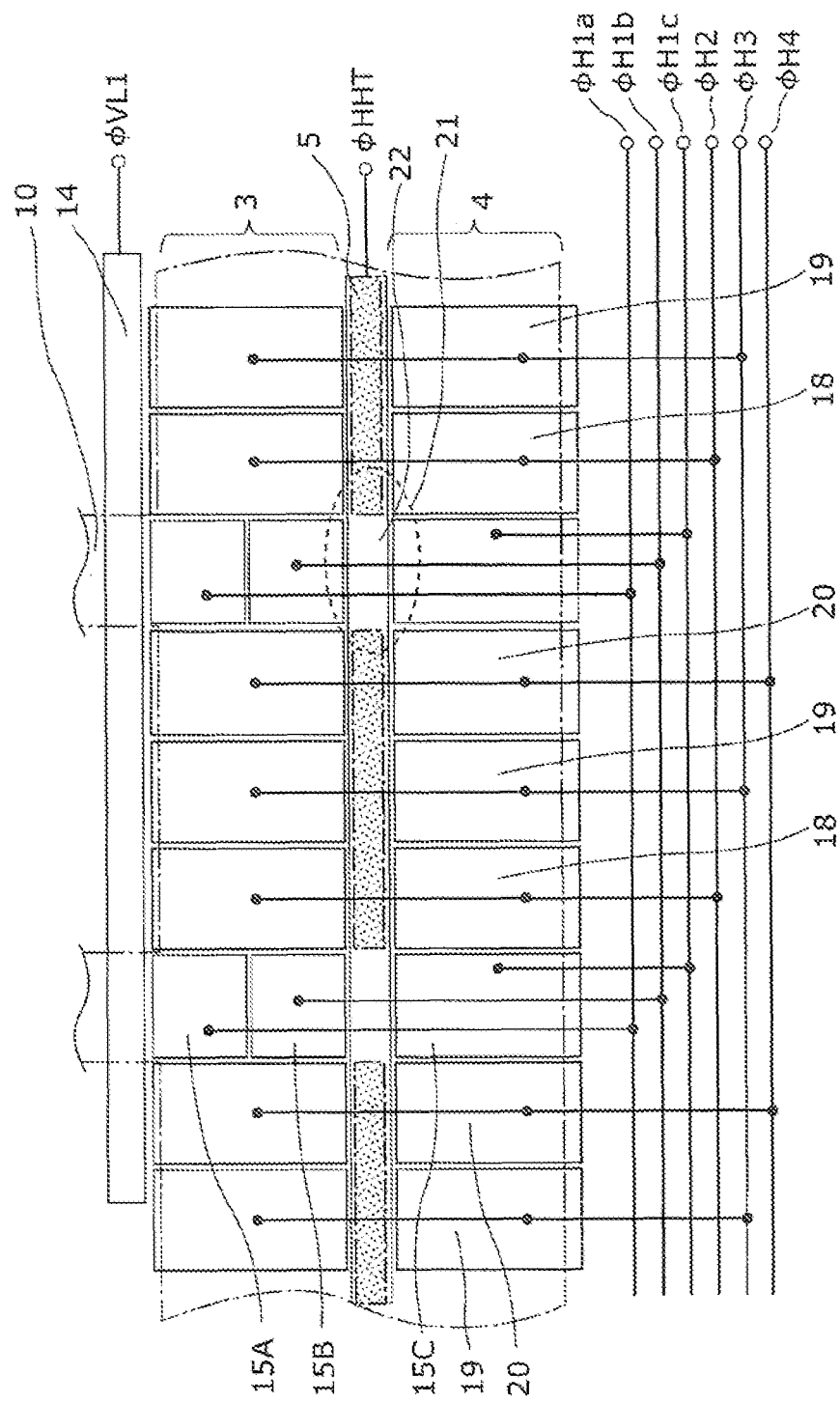
FIG. 17A is a partial configuration diagram of a solid-state imaging device according to a sixth embodiment of the present invention.
Figure 17B:
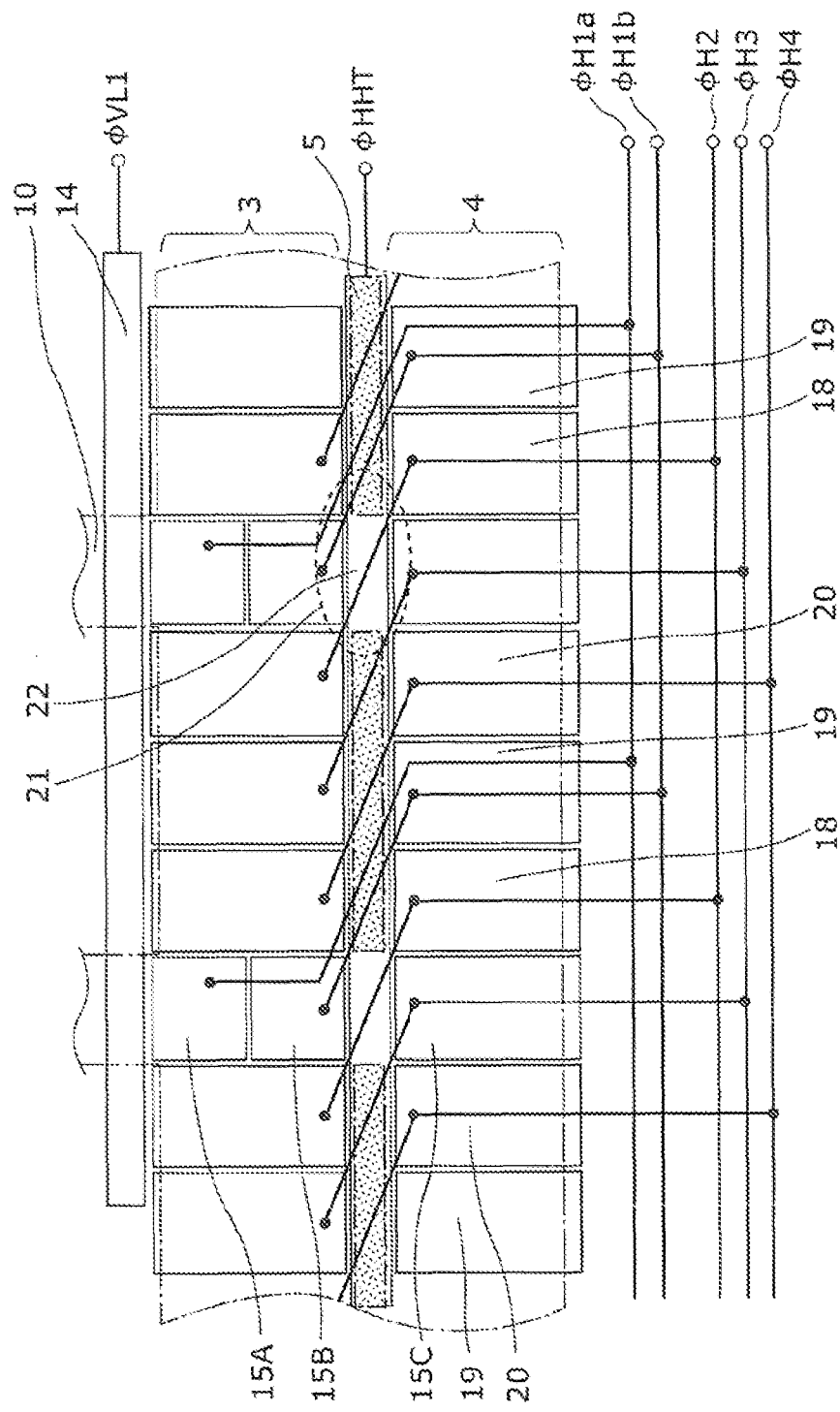
FIG. 17B is a partial configuration diagram of the solid-state imaging device according to the sixth embodiment of the present invention.

FIG. 17B is a partial configuration diagram of a solid-state imaging device according to the sixth embodiment of the present invention. For comparison, FIG. 17A shows the first horizontal transfer unit 3 and the second horizontal transfer unit 4 in the solid-state imaging device 100 according to the first embodiment. In FIG. 17A and FIG. 17B, same components are designated by same reference numerals as those in FIG. 2B.

The present embodiment is different from the first embodiment in that the horizontal transfer electrode in the first horizontal transfer unit 3 is shifted from the horizontal transfer electrode in the second horizontal transfer unit 4 by two phases in the horizontal direction, and these electrodes are commonly wired.

Namely, in the present embodiment, as shown in FIG. 17B, the first horizontal transfer electrode 15B in the first horizontal transfer unit 3 is commonly wired to the third horizontal transfer electrode 19 in the second horizontal transfer unit 4, and the transfer pulse φH1$b$ is applied to these electrodes. The second horizontal transfer electrode 18 in the first horizontal transfer unit 3 is commonly wired to the fourth horizontal transfer electrode 20 in the second horizontal transfer unit 4, and the transfer pulse φH4 is applied to these electrodes.

Similarly, the third horizontal transfer electrode 19 in the first horizontal transfer unit 3 is commonly wired to the first horizontal transfer electrode 15C in the second horizontal transfer unit 4, and the transfer pulse φH3 is applied to these electrodes. The fourth horizontal transfer electrode 20 in the first horizontal transfer unit 3 is commonly wired to the second horizontal transfer electrode 18 in the second horizontal transfer unit 4, and the transfer pulse φH2 is applied' to these electrodes.

Thus, four phases of the transfer pulses φH1$b$ and φH2 to φH4 are applied to the corresponding electrodes in horizontal transfer, enabling horizontal four-phase drive. The same transfer pulse as φH1$b$ is applied to the first horizontal transfer electrode 15A in the first horizontal transfer unit 3.

Contrary to this, as shown in FIG. 17A, in the first horizontal transfer unit 3 and second horizontal transfer unit 4 in the first embodiment, the first horizontal transfer electrodes 15A, 15B, and 15C, the second horizontal transfer electrode 18, the third horizontal transfer electrode 19, and the fourth horizontal transfer electrode 20 are independently wired, and the transfer pulses φH1$a$, φH1$b$, φH1$c$, φH2, φH3, and φH4 are applied to these electrodes, respectively.

For example, in the first embodiment, as shown in FIG. 17A, the first horizontal transfer electrode 15C that receives the signal charges from the intermediate transfer unit 21 in the second horizontal transfer unit 4 is composed of an independent electrode, and the transfer pulse φH1$c$ is applied thereto. Meanwhile, in the present embodiment, as shown in FIG. 178, the horizontal transfer electrode in the first horizontal transfer unit 3 and the horizontal transfer electrode in the second horizontal transfer unit 4 are commonly wired with being shifted by two phases. Thereby, in the present embodiment, a wiring is shared by the first horizontal transfer electrode 15C in the second horizontal transfer unit 4 that receives the signal charges from the intermediate transfer unit 21 and the third horizontal transfer electrode 19 in the first horizontal transfer unit 3. Accordingly, the terminals for applying φH1$c$ can be eliminated, reducing the number of terminals in the package.

Moreover, the signal charges are transferred from the first horizontal transfer unit 3 with being two-phase shifted from the signal charges transferred from the second horizontal transfer unit 4. The layout of the horizontal transfer electrode, the number of electrodes, and the transfer pulse are adjusted in the vicinity of the output ends in the first horizontal transfer unit 3 and the second horizontal transfer unit 4. Thereby, the first horizontal transfer unit 3 and the second horizontal transfer unit 4 can output the signal charges at the same phase.

Here, a transfer operation to transfer the signal charges in the second vertical transfer unit 10 via the first horizontal transfer unit 3 and the intermediate transfer unit 21 to the second horizontal transfer unit 4 will be described using FIG. 18A to FIG. 18F.

FIG. 18A to FIG. 18F are simplified views of the configuration of the first horizontal transfer unit 3 and the second horizontal transfer unit 4 and the horizontal transfer electrodes in the first and second horizontal transfer units in the present embodiment, and same components are designated by same reference numerals at those in FIG. 178. Each of the transfer pulses is shown in the horizontal transfer electrode to which the transfer pulse is applied. In FIG. 18A to FIG. 18F, a hatched horizontal transfer electrode represents a horizontal transfer electrode to which a transfer pulse at a low level is applied, and a non-hatched horizontal transfer electrode represents a horizontal transfer electrode to which a transfer pulse at a high level is applied. A blank circle represents the signal charges.

First, in FIG. 18A, the transfer pulse φVL1 at a low level is applied to the final vertical transfer electrode 14. The transfer pulses φH1a to be applied to the first horizontal transfer electrode 15A, φH1b to be applied to the first horizontal transfer electrode 15B, φH3 to be applied to the first horizontal transfer electrode 15C, and φHHT to be applied to the branch transfer electrode 22 in the intermediate transfer unit 21 are controlled to be a high level. Thereby, the signal charges (blank circles in FIG. 18A) are transferred from the second vertical transfer unit 10 to the first horizontal transfer unit 3 and the second horizontal transfer unit 4. At this time, φH2 is applied to the fourth horizontal transfer electrode 20 in the first horizontal transfer unit 3 and the second horizontal transfer electrode 18 in the second horizontal transfer unit 4, and a transfer pulse φH4 at the low level is applied to the second horizontal transfer electrode 18 in the first horizontal transfer unit 3 and the fourth horizontal transfer electrode 20 in the second horizontal transfer unit 4. Thereby, a potential barrier is formed.

Figure 18C:
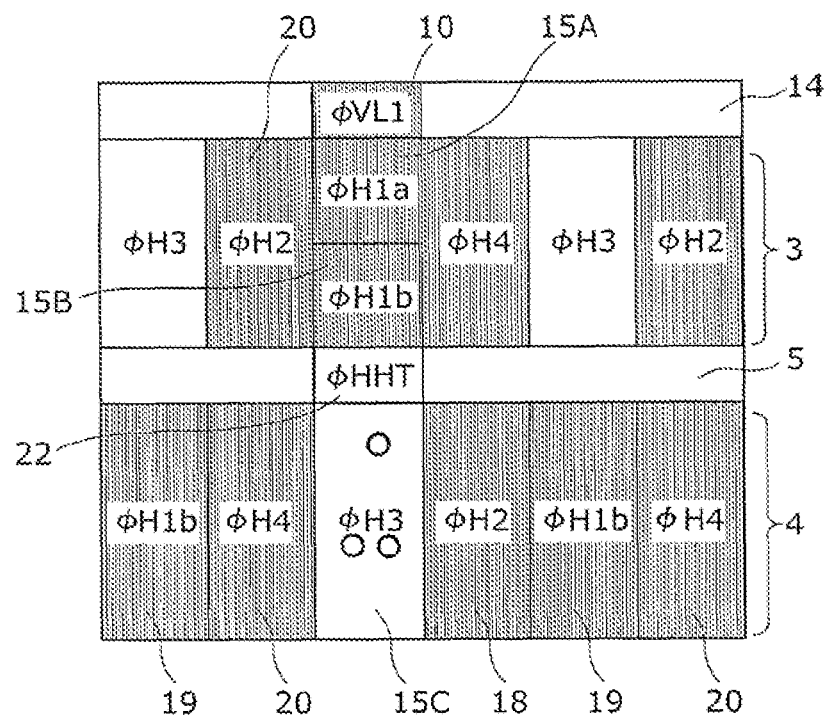
FIG. 18C is a diagram showing transfer of signal charges in the sixth embodiment of the present invention.
Figure 18D:
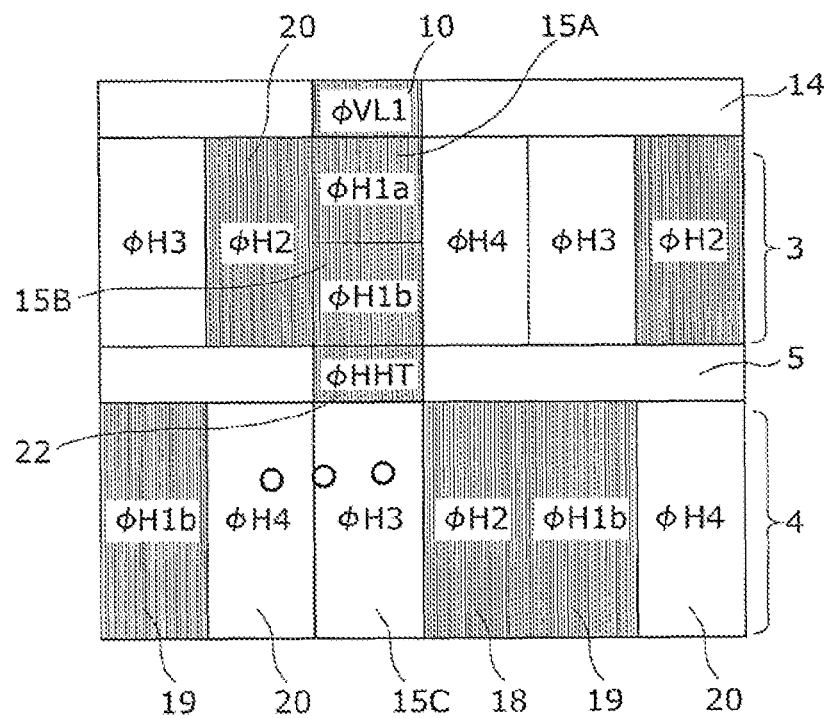
FIG. 18D is a diagram showing transfer of signal charges in the sixth embodiment of the present invention.

Next, in FIG. 18B, FIG. 18C, and FIG. 18D, the transfer pulses φH1a to be applied to the first horizontal transfer electrode 15A, φH1b to be applied to the first horizontal transfer electrode 15B, φH3 to be applied to the first horizontal transfer electrode 15C, and φHHT to be applied to the branch transfer electrode 22 are sequentially changed to the low level to transfer the signal charges in the first horizontal transfer unit 3 (blank circles) to under the first horizontal transfer electrode 15C and the fourth horizontal transfer electrode 20 in the second horizontal transfer unit 4.

Figure 18E:
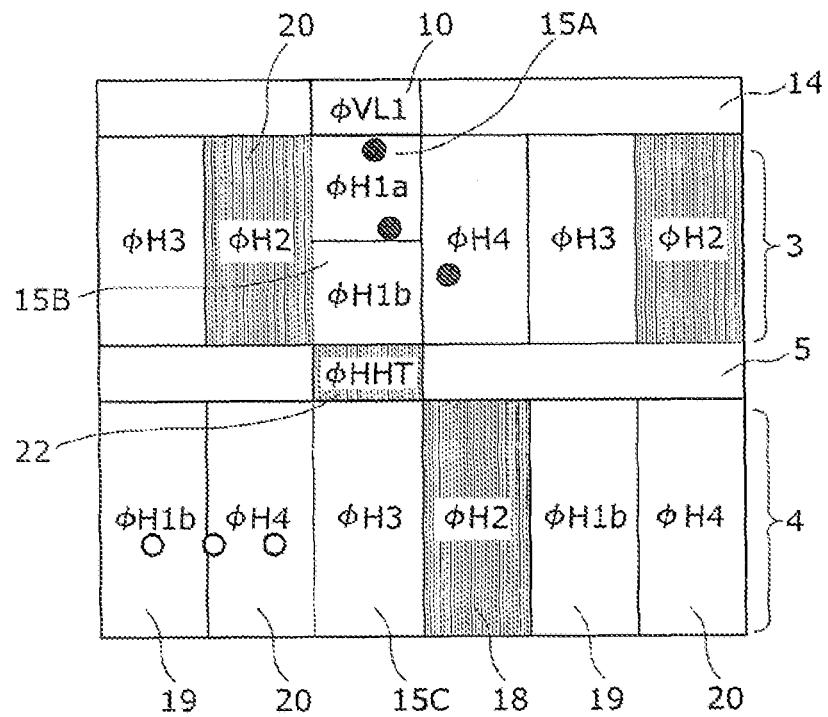
FIG. 18E is a diagram showing transfer of signal charges in the sixth embodiment of the present invention.

Subsequently, as shown in FIG. 18E, the transfer pulse φHHT to be applied to the branch transfer electrode 22 in the intermediate transfer unit 21 is kept at the low level. The transfer pulse φH1a to be applied to the first horizontal transfer electrode 15A in the first horizontal transfer unit 3, and the transfer pulse φH1b to be applied to the first horizontal transfer electrode 15B in the first horizontal transfer unit 3 and the third horizontal transfer electrode 19 in the second horizontal transfer unit 4 are controlled to be the high level. The signal charges (blank circles) transferred to the second horizontal transfer unit 4 are transferred to under the third horizontal transfer electrode 19. Further, the next signal charges (solid circles in FIG. 18E) are transferred from the second vertical transfer unit 10 to the first horizontal transfer unit 3. In FIG. 18E, in the first horizontal transfer unit 3, the first horizontal transfer electrodes 15A and 15B, the second horizontal transfer electrode 18, and the third horizontal transfer electrode 19 receive the signal charges (solid circles) from the second vertical transfer unit 10. Alternatively, the first horizontal transfer electrodes 15A and 15B and the second horizontal transfer electrode 18 in the first horizontal transfer unit 3 may receive the signal charges (solid circles).

Figure 18F:
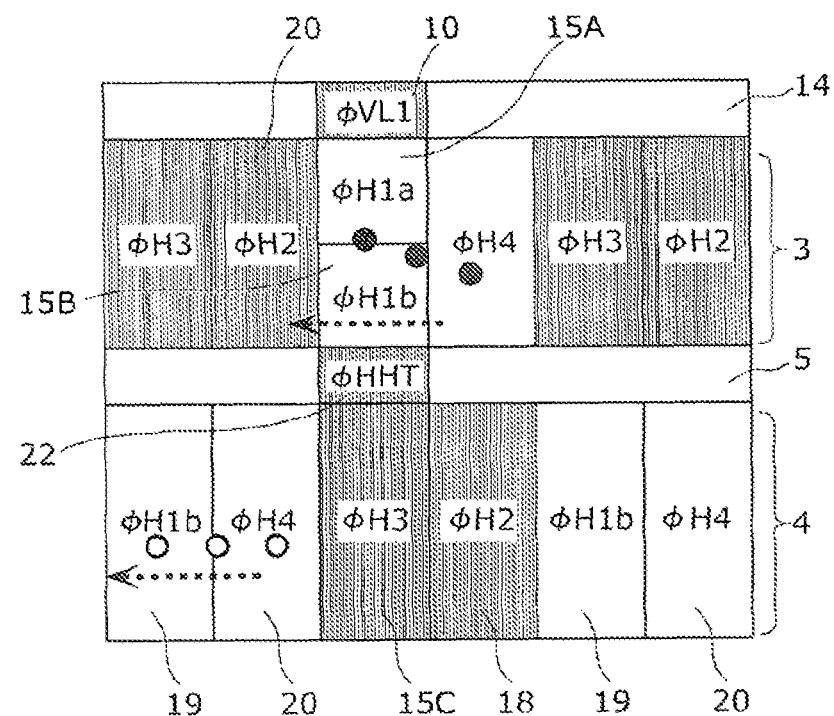
FIG. 18F is a diagram showing transfer of signal charges in the sixth embodiment of the present invention.

Subsequently, as shown in FIG. 18F, the transfer pulse φH3 to be applied to the third horizontal transfer electrode 19 in the first horizontal transfer unit 3 and the first horizontal transfer electrode 15C in the second horizontal transfer unit 4 is controlled to be the low level. The signal charges are stored by two adjacent electrodes, and a barrier is formed by other two adjacent electrodes. Subsequently, by applying a transfer pulse, φH1b, φH2, φH3, and φH4 are sequentially changed to be a transfer pulse at a level different from the level at present. Thereby, in first horizontal transfer unit 3 and second horizontal transfer unit 4, the signal charges can be horizontally transferred by horizontal four-phase drive with being two-phase shifted in the horizontal direction, and can be output.

As above, according to the present embodiment, a solid-state imaging device can be provided in which the number of terminals for the transfer pulses to be applied to the respective horizontal transfer electrodes can be reduced compared to the first embodiment.

The present invention will not be limited to the embodiments described above, and various improvements and modifications may be made without departing from the gist of the present invention.

For example, in the first to sixth embodiments, the structure has been shown in which two horizontal transfer units of the first horizontal transfer unit 3 and the second horizontal transfer unit 4 are arranged in parallel. The present invention can also be used when the horizontal transfer unit is composed of three or more horizontal transfer units. Moreover, an example of the configuration has been shown in which in the first horizontal transfer unit 3, the horizontal transfer electrode for vertically transferring the signal charges to the intermediate transfer unit 21 and the second horizontal transfer unit 4 are composed of two column direction electrodes (for example, the first horizontal transfer electrodes 15A and 15B). Alternatively, the horizontal transfer electrode can be composed of three or more horizontal transfer electrodes.

The column direction electrode may have a rectangular shape in which the horizontal length on the side of the vertical transfer unit is equal to the horizontal length on the side of the intermediate transfer unit, or may have a trapezoidal shape in which the horizontal length on the side of the vertical transfer unit is shorter than the horizontal length on the side of the intermediate transfer unit. The column direction electrode may be configured to have a predetermined angle to the horizontal direction at the interface between the column direction electrodes.

In the embodiments, a four-phase driven solid-state imaging device has been described as an example, but the driving system will not be limited to four-phase drive. A driving system other than four-phase drive may be used.

Moreover, the configuration of the solid-state imaging device according to the present invention will not be limited to those of the embodiments above, and the solid-state imaging device according to the present invention may have any configuration. For example, the configuration of the transfer control unit, the vertical transfer electrode, the intermediate electrode, and the final vertical transfer electrode, or the combination thereof may be modified.

Moreover, the present invention includes other embodiments by implementing any combination of the components in the embodiment, modifications obtained by making a variety of modifications conceived by persons skilled in the art on the embodiment without departing from the gist of the present invention, and a variety of devices including the solid-state imaging device according to the present invention. For example, the present invention includes a movie camera including the solid-state imaging device according to the present invention.

Although only some exemplary embodiments of the present invention have been described in detail above, those skilled in the art will readily appreciate that many modifications are possible in the exemplary embodiments without materially departing from the novel teachings and advantages of the present invention. Accordingly, all such modifications are intended to be included within the scope of the present invention.

INDUSTRIAL APPLICABILITY

The solid-state imaging device according to the present invention can provide low electricity consumption and high speed drive at the same time, and can attain a high speed moving picture mode such as a full HD moving picture. Accordingly, the solid-state imaging device according to the present invention is useful particularly as a solid-state imaging device for digital still cameras.

The invention claimed is:
1. A solid-state imaging device comprising:
a plurality of photoelectric conversion units two-dimensionally arranged;
a plurality of vertical transfer units, each of which is provided for a corresponding one of columns of the photoelectric conversion units, has a plurality of vertical transfer electrodes, and is configured to vertically transfer signal charges read from the photoelectric conversion units;
a plurality of horizontal transfer units, each of which has a plurality of horizontal transfer electrodes, and is configured to horizontally transfer the signal charges transferred from the vertical transfer unit; and
an intermediate transfer unit provided between the plurality of horizontal transfer units, having a branch transfer electrode, and configured to transfer the signal charges between the plurality of horizontal transfer units,
wherein each of the horizontal transfer units includes a first horizontal transfer unit configured to receive the signal charges from the vertical transfer unit, and a second horizontal transfer unit configured to receive the signal charges from the first horizontal transfer unit,
in the first horizontal transfer unit, one of the horizontal transfer electrodes includes a plurality of column direction electrodes that are disposed adjacent to one another in the vertical direction and transfer the signal charges via the intermediate transfer unit to the second horizontal transfer unit, and
the plurality of vertical transfer electrodes, the plurality of horizontal transfer electrodes, and the branch transfer electrode are a single layer electrode.
2. The solid-state imaging device according to claim 1, wherein each of the column direction electrodes has a rectangular shape in which a horizontal length on a side of the vertical transfer unit is equal to a horizontal length on a side of the intermediate transfer unit.
3. The solid-state imaging device according to claim 1, wherein each of the column direction electrodes is formed to have a horizontal length on the side of the vertical transfer unit shorter than a horizontal length on the side of the intermediate transfer unit.

4. The solid-state imaging device according to claim 1, wherein each of the column direction electrodes is formed to have a predetermined angle in the horizontal direction at an interface between the column direction electrodes.
5. The solid-state imaging device according to claim 1, wherein the second horizontal transfer unit includes the column direction electrode having the same configuration of the column direction electrode in the first horizontal transfer unit.
6. The solid-state imaging device according to claim 1, wherein each of the horizontal transfer units includes three or more horizontal transfer electrodes to which three or more phases of a transfer pulse are applied, the three or more phases of a transfer pulse forming one transfer packet.
7. The solid-state imaging device according to claim comprising
a transfer control unit configured to select one of the vertical transfer units that transfers the signal charges to the horizontal transfer unit corresponding to the selected vertical transfer unit,
wherein each of the horizontal transfer units has three or more horizontal transfer electrodes to which three or more phases of a transfer pulse is applied, the three or more phases of a transfer pulse forming one transfer packet.
8. The solid-state imaging device according to claim 7, wherein the vertical transfer unit includes
a plurality of first vertical transfer units, each of which is provided for a corresponding one of columns of the photoelectric conversion units and is configured to transfer the signal charges from the corresponding column of the photoelectric conversion units; and
a second vertical transfer unit provided adjacent to the first vertical transfer units in the vertical direction and including a horizontal series of m columns of the first vertical transfer unit, m being an integer of 2 or more.
9. The solid-state imaging device according to claim 8, wherein one end of the second vertical transfer unit connected to the first vertical transfer unit and other end of the second vertical transfer unit on a side opposite to the first vertical transfer unit are provided continuously with a portion of the first horizontal transfer unit corresponding to a position of the column direction electrode in the first horizontal transfer unit.
10. The solid-state imaging device according to claim 7, wherein the plurality of column direction electrodes is independently provided in a position not corresponding to a position of any of the plurality of vertical transfer units.
11. The solid-state imaging device according to claim 1, wherein each of the horizontal transfer units is composed of a repeating set of four horizontal transfer electrodes to which four phases of a transfer pulse are applied, the four phases of a transfer pulse forming one transfer packet, and
the horizontal transfer electrode in the first horizontal transfer unit is two-phase shifted from the horizontal transfer electrode in the second horizontal transfer unit in the horizontal direction, and the horizontal transfer electrode in the first horizontal transfer unit and the horizontal transfer electrode in the second horizontal transfer unit are commonly wired.
12. A method of driving a solid-state imaging device, wherein the solid-state imaging device includes:
a plurality of photoelectric conversion units two-dimensionally arranged;

a plurality of vertical transfer units, each of which is provided for a corresponding one of columns of the photoelectric conversion units, and configured to vertically transfer signal charges read from the photoelectric conversion unit;

a plurality of horizontal transfer units, each of which has a plurality of horizontal transfer electrodes, and is configured to horizontally transfer the signal charges from the vertical transfer unit, the vertical transfer units being disposed in parallel in the vertical direction; and an intermediate transfer unit provided between the plurality of horizontal transfer units, and configured to transfer the signal charges between the plurality of horizontal transfer units, and each of the horizontal transfer units includes a first horizontal transfer unit configured to receive the signal charges from the vertical transfer unit, and a second horizontal transfer unit configured to receive the signal charges from the first horizontal transfer unit, and in the first horizontal transfer unit, one of the horizontal transfer electrodes includes a plurality of column direction electrodes that are disposed adjacent to one another in the vertical direction, and transfer the signal charges via the intermediate transfer unit to the second horizontal transfer unit, the method comprising:

applying different transfer pulses to the plurality of column direction electrodes to form a potential gradient in the vertical direction, when the signal charges are transferred between the plurality of horizontal transfer units; and applying the same transfer pulse to the plurality of column direction electrodes to equalize a potential in the vertical direction, when the signal charges are horizontally transferred in the horizontal transfer unit.

13. A camera comprising the solid-state imaging device according to claim 1.

* * * * *